(12) United States Patent
Ware et al.

(10) Patent No.: US 11,010,263 B2
(45) Date of Patent: *May 18, 2021

(54) HIGH PERFORMANCE PERSISTENT MEMORY

(71) Applicant: Rambus Inc., Sunnyvale, CA (US)

(72) Inventors: Frederick A. Ware, Los Altos Hills, CA (US); J. James Tringali, Los Altos, CA (US); Ely Tsern, Los Altos, CA (US)

(73) Assignee: Rambus Inc., San Jose, CA (US)

( * ) Notice: Subject to any disclaimer, the term of this patent is extended or adjusted under 35 U.S.C. 154(b) by 120 days.

This patent is subject to a terminal disclaimer.

(21) Appl. No.: 16/254,920

(22) Filed: Jan. 23, 2019

(65) Prior Publication Data

US 2019/0205222 A1 Jul. 4, 2019

Related U.S. Application Data

(63) Continuation of application No. 15/114,795, filed as application No. PCT/US2014/071597 on Dec. 19, 2014, now Pat. No. 10,191,822.

(60) Provisional application No. 61/942,567, filed on Feb. 20, 2014.

(51) Int. Cl.
| | |
|---|---|
| *G06F 11/14* | (2006.01) |
| *G11C 7/20* | (2006.01) |
| *G11C 14/00* | (2006.01) |
| *G06F 3/06* | (2006.01) |

(52) U.S. Cl.
CPC ........ *G06F 11/1471* (2013.01); *G06F 3/0619* (2013.01); *G06F 3/0634* (2013.01); *G06F 3/0647* (2013.01); *G06F 3/0685* (2013.01); *G11C 7/20* (2013.01); *G11C 14/0018* (2013.01); *G06F 2201/805* (2013.01); *G06F 2201/84* (2013.01)

(58) Field of Classification Search
CPC ............ G06F 11/1471; G06F 11/2074; G06F 11/1451; G06F 11/1469; G06F 11/1456; G06F 2212/1024; G06F 2212/2532

See application file for complete search history.

(56) References Cited

U.S. PATENT DOCUMENTS

| | | | |
|---|---|---|---|
| 6,631,478 B1 * | 10/2003 | Wang | G06F 11/1471 714/15 |
| 7,124,244 B2 | 10/2006 | Shimada | |
| 7,315,951 B2 * | 1/2008 | Hanrieder | G06F 1/30 711/162 |
| 7,495,984 B2 | 2/2009 | Kim et al. | |
| 8,453,095 B2 | 5/2013 | Su et al. | |
| 8,504,793 B2 | 8/2013 | Fisher et al. | |
| 8,516,187 B2 | 8/2013 | Chen et al. | |

(Continued)

OTHER PUBLICATIONS

Notification Concerning Transmittal of International Preliminary Report on Patentability dated Sep. 1, 2016 re: Int'l Appln. No. PCT/US14/071597. 16 Pages.

(Continued)

*Primary Examiner* — Nadeem Iqbal
(74) *Attorney, Agent, or Firm* — Lowenstein Sandler LLP

(57) ABSTRACT

The embodiments described herein describe technologies for non-volatile memory persistence in a multi-tiered memory system including two or more memory technologies for volatile memory and non-volatile memory.

20 Claims, 33 Drawing Sheets

(56) References Cited

U.S. PATENT DOCUMENTS

| | | | |
|---|---|---|---|
| 9,619,330 B2* | 4/2017 | Faulhaber | G06F 11/1441 |
| 9,880,754 B2* | 1/2018 | Berke | G06F 3/0632 |
| 10,191,822 B2* | 1/2019 | Ware | G06F 3/0634 |
| 2005/0283648 A1 | 12/2005 | Ashmore | |
| 2006/0107005 A1 | 5/2006 | Philippe Andre et al. | |
| 2007/0276995 A1* | 11/2007 | Caulkins | G06F 3/0616 |
| | | | 711/113 |
| 2008/0235467 A1 | 9/2008 | Tagawa | |
| 2008/0244203 A1 | 10/2008 | Gorobets et al. | |
| 2009/0268513 A1 | 10/2009 | De Ambroggi et al. | |
| 2010/0121865 A1 | 5/2010 | Vaid et al. | |
| 2011/0072430 A1 | 3/2011 | Mani | |
| 2011/0138079 A1 | 6/2011 | Esaka et al. | |
| 2011/0283070 A1* | 11/2011 | Rischar | G05B 19/042 |
| | | | 711/162 |
| 2012/0084491 A1 | 4/2012 | Park et al. | |

OTHER PUBLICATIONS

PCT International Search Report dated Aug. 28, 2015 in International Application No. PCT/US2014/071597. 26 pages.

\* cited by examiner

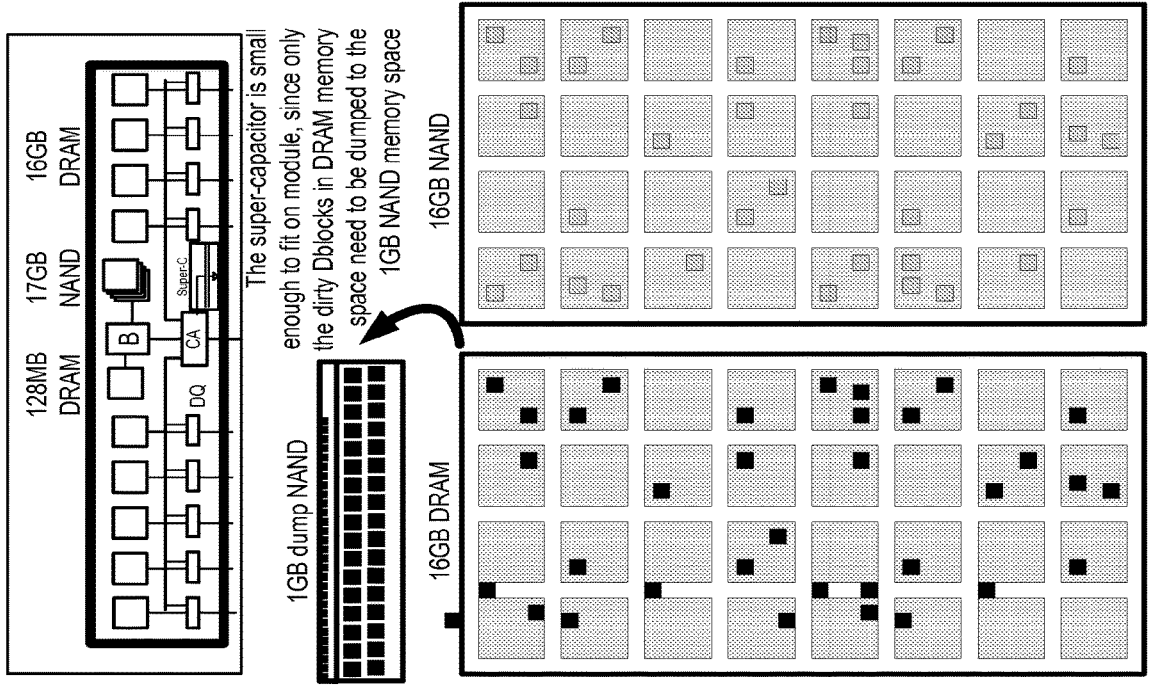
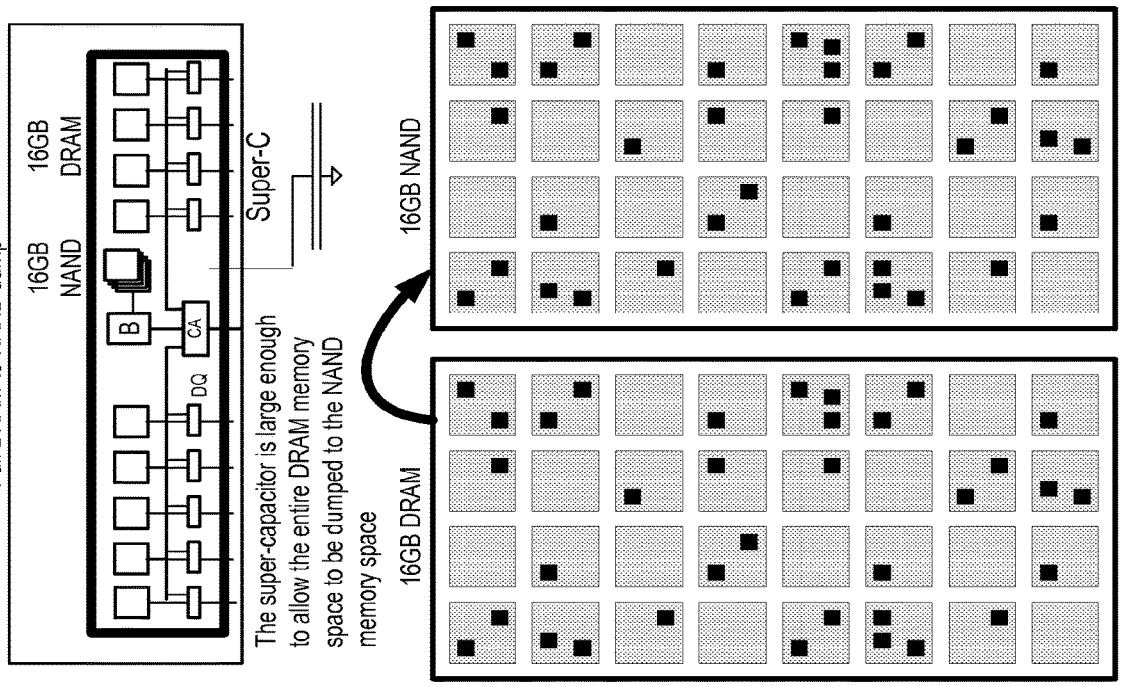
FIG. 11

Improved NAND organization
[2] Write transaction (from host)

FIG. 27

Improved NAND organization
[3] Search K memory (tags)

Improved NAND organization
[5] Tail-to-head consolidation

FIG. 30 Improved NAND organization [6] Power-Loss (DRAM-to-dump-NAND)

HIGH PERFORMANCE PERSISTENT MEMORY

RELATED APPLICATIONS

The application is continuation of U.S. Ser. No. 15/114,795, filed on Jul. 27, 2016, which is the National Phase of International Application Number PCT/US2014/071597, filed Dec. 19, 2014, which claims the benefit of U.S. Provisional No. 61/942,567, filed Feb. 20, 2014, the entire contents of all are incorporated by reference.

BACKGROUND

Computing memory systems are generally composed of one or more dynamic random access memory (DRAM) integrated circuits, referred to herein as DRAM devices, which are connected to one or more processors. Multiple DRAM devices may be arranged on a memory module, such as a dual in-line memory module (DIMM). A DIMM includes a series of DRAM devices mounted on a printed circuit board (PCB) and are typically designed for use in personal computers, workstations, servers, or the like. There are different types of memory modules, including a load-reduced DIMM (LRDIMM) for Double Data Rate Type three (DDRB), which have been used for large-capacity servers and high-performance computing platforms. Memory capacity may be limited by the loading of the data query (DQ) bus and the request query (RQ) bus associated with the user of many DRAM devices and DIMMs. LRDIMMs may increase memory capacity by using a memory buffer component (also referred to as a register). Registered memory modules have a register between the DRAM devices and the system's memory controller. For example, a fully buffer componented DIMM architecture introduces an advanced memory buffer component (AMB) between the memory controller and the DRAM devices on the DIMM. The memory controller communicates with the AMB as if the AMB were a memory device, and the AMB communicates with the DRAM devices as if the AMB were a memory controller. The AMB can buffer component data, command and address signals. With this architecture, the memory controller does not write to the DRAM devices, rather the AMB writes to the DRAM devices.

BRIEF DESCRIPTION OF THE DRAWINGS

The present embodiments are illustrated by way of example, and not of limitation, in the figures of the accompanying drawings in which:

FIG. 11 compares a prior NVDIMM solution (left) to an incremental-state-capture embodiment (right) that uses only DRAM and NAND FLASH memory types

FIG. 16 illustrates, for the configuration of FIG. 12, incremental state capture that occurs, e.g., upon power loss to the.

FIG. 27 illustrates, for the module of FIG. 21, module activities for a tag-scanning process.

DETAILED DESCRIPTION

The embodiments described herein describe technologies for non-volatile memory persistence in a multi-tiered memory system including two or more memory technologies for volatile memory and non-volatile memory. The embodiments described herein describe technologies for maximizing information technology (IT) operational efficiency by creating a robust persistent memory system with higher performance and lower operational cost and lower material costs than conventional solutions. The embodiments described herein may provide higher performance through a multi-tiered memory type system that blends memory technologies and delta data management. The embodiments described herein may be used to lower the total cost of ownership by eliminating or reducing the need for batteries or other auxiliary power sources during unexpected shutdown of the system attached to the memory. The embodiments described herein may also enable lower cost packaging solutions with increased packaging density, driving lower operational costs.

There are some applications, such as mission-critical applications, that require minimum downtime. For example, banking and financial services, retail service, telecommunication service, and even government services may use financial analytics, data analytics, online transaction processing (OLTP), and in-memory database (IMDB) type applications that primarily rely on main memory for computer data storage, instead of disk storage mechanisms. Computing systems for these applications may use non-volatile dual in-line memory modules (NVDIMMs). NVDIMMs are computer memory DRAM DIMMs that retain data even when electrical power is removed due to various events, such as from an unexpected power loss, system crash or from a normal system shutdown. NVDIMMs can be used to recover data in the computer memory in the event of one of the power-loss events.

Figure 1:
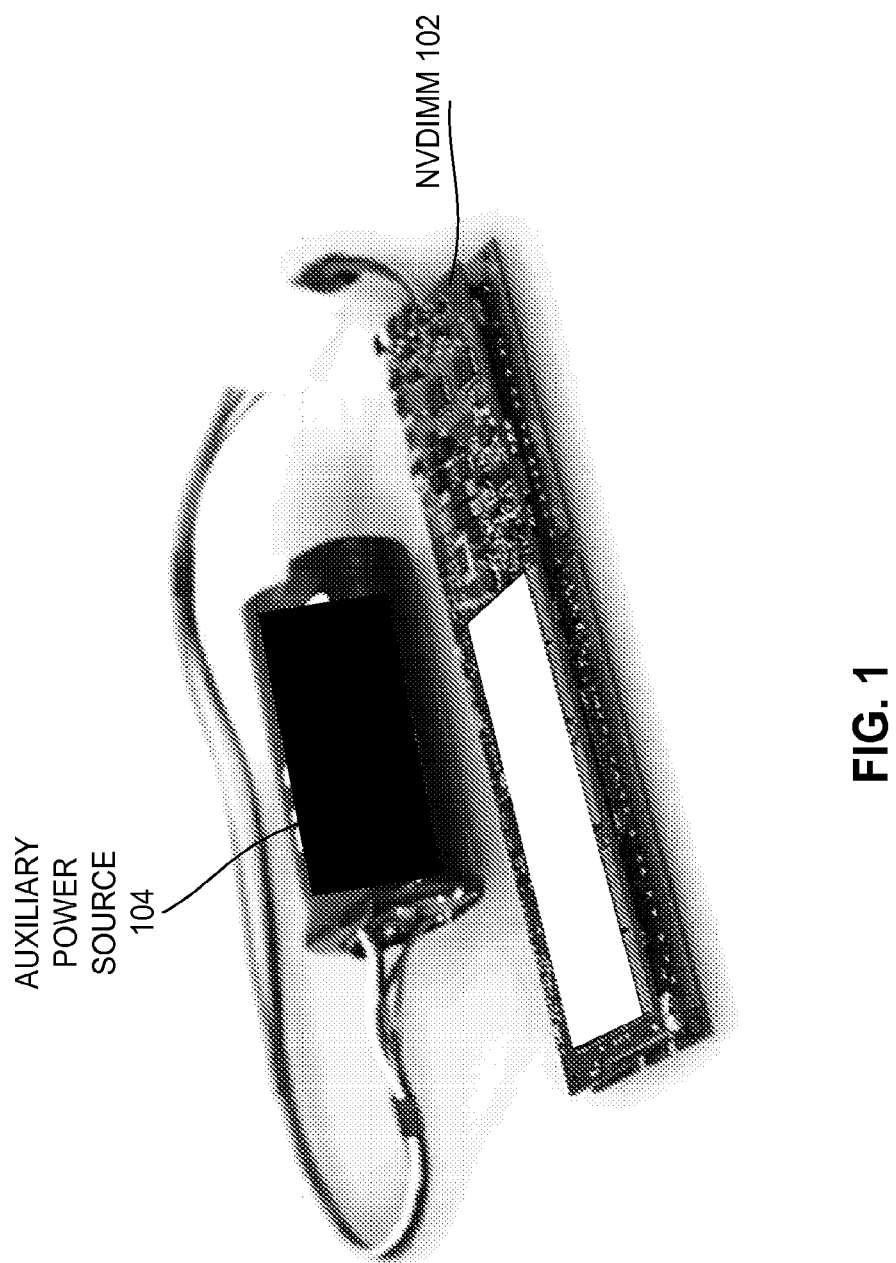
FIG. 1 shows a non-volatile DIMM (NVDIMM) for persistent memory powered by an auxiliary power source according to a conventional implementation.

Some conventional NVDIMMs are battery-backed-up DIMMs, which use a backup battery or supercapacitor to sustain power to the volatile DIMM for up to a specified amount of time based on battery capacity and battery charge. FIG. 1 shows a NVDIMM 102 for persistent memory powered by an auxiliary power source 104 according to a conventional implementation. The auxiliary power source 104 includes batteries connected to the NVDIMM in order to provide power in the event of power loss. Batteries/supercapacitors have several maintenance and real estate concerns in computer-based applications, and have a limited life span. Some of these NVDIMMs use DRAM technology (e.g., DDR3 DRAM) for storing data and use NAND FLASH to preserve an image of the data stored in DRAM. The NVDIMM is a mixed memory subsystem that combines the speed and endurance of DRAM, together with the non-volatile data retention properties of NAND flash. NVDIMMs using DRAM and NAND technology can deliver high speed and low latency "non-volatile/persistent" memory with unlimited read/write activity that can sustain itself from host power failure or a system crash. These conventional solutions, however, have high material and operational costs due to the auxiliary power sources being used. Such systems also perform a full save-to-FLASH operation at the time of the shutdown event, which is both time consuming and another source of failure, should the battery power not be sufficient to create the snapshot. To partially mitigate this last concern, some systems do periodic snapshotting, e.g., a system halt for a full save-to-FLASH operation at some operating interval.

The embodiments described herein can use a multi-tier memory scheme (e.g., two-tier or three-tier memory type scheme) to divide a write stream among multiple memory technologies. The embodiments described herein can provide high endurance and performance type memory technologies at the root and the lowest-bit economy type memory technologies on the backsides. The embodiments described herein may manage the write stream as a series of linear update requests, including journal like tracking of data change units. The embodiments described herein can reclaim journal space by periodically and/or constantly in background patching a base image with a logged update stream. The embodiments described herein can be designed to seamlessly plug into an existing JEDEC NVDIMM framework and can support legacy NVDIMM snapshotting as well as new modes of incremental/continuous snapshotting that may run in background with little impact on system operation. The embodiments described herein may provide journaling controls, and the journal controls can be optional and switchable using JEDEC supported configuration modes. In some cases, the NVDIMMs described herein are backward compatible with existing solutions through a mode switch. The divided write streams to multiple tiers can also maximize effective NVM endurance. The embodiments described herein can be used in applications to provide zero to small system hold time requirement after failure. High frequency updates may minimize data loss between events, even were the auxiliary power source to fail. The embodiments described herein can provide an improved memory system by implementing working memory persistence using multiple memory device technologies and maintaining data fidelity without requiring large auxiliary power sources, at least under some reasonable write bandwidth constraints. In some embodiments, the NVDIMMs can support high image backup rates through memory device technology access blending. In some embodiments, the NVDIMMs can support high image backup rates by tracking data change units and frequency journal updates. In other embodiments, the NVDIMMs can implement working memory persistence using a specific memory technology for journaling and a separate memory technology for saving a baseline image.

Figure 2:
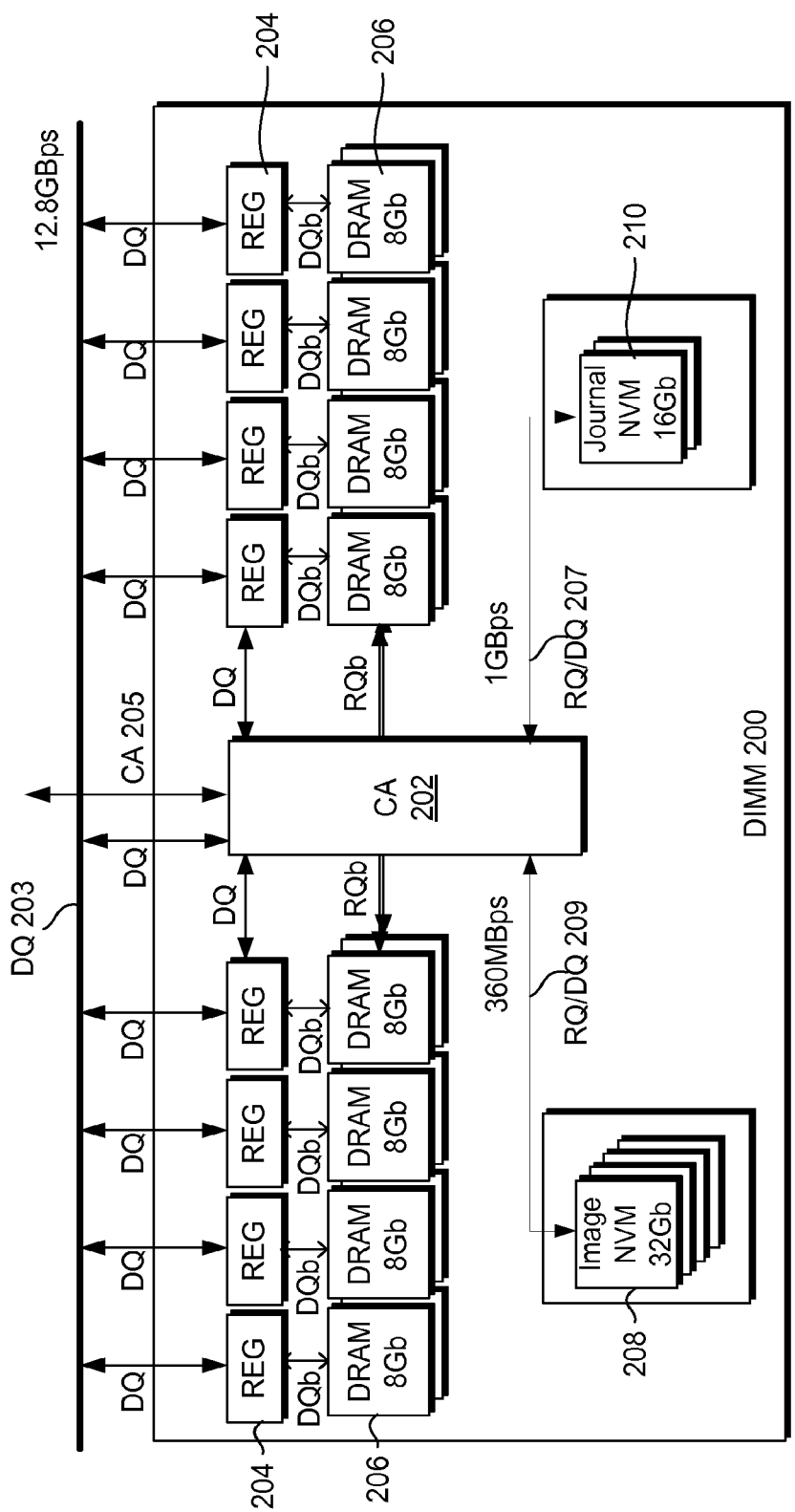
FIG. 2 is a block diagram of a NVDIMM with a multi-tiered memory scheme for persistent memory according to one implementation.

FIG. 2 is a block diagram of a NVDIMM 200 with a multi-tiered memory scheme for persistent memory without auxiliary power source (or with a reduced auxiliary power source, not shown) according to one implementation. The NVDIMM 200 can be one of multiple DIMMs in one of multiple memory sockets of a computer system. The NVDIMM 200 includes a CA buffer component 202 (hereinafter referred to as just CA buffer or CA-BUFF), multiple distributed data buffer components 204 (labeled as REG) (herein referred to as DQ buffer or as DQ-BUFF), and multiple DRAM devices 206. The CA buffer 202 and distributed data buffers 204 are coupled between the DRAM devices 206 and a memory controller (not illustrated) to buffer the data signals. In particular, the CA buffer 202 and distributed data buffers 204 are coupled to receive data signals from the memory controller via a data bus (DQ) and a request bus (RQ) or CA bus 205, and provide data signals to the DRAM device 116 on the buffered data bus (DQb) and the buffered request bus (RQb). In one implementation, the CA buffer 202 and distributed data buffers 204 reside in a data buffer device having a common carrier substrate such as, for example, an integrated circuit ("IC") die substrate, a multi-chip module substrate, or the like. Alternatively, the CA buffer 202 and distributed data buffers 204 may be one or more separate integrated circuits and/or discrete components. In another implementation, the CA buffer is a data buffer device and the distributed data buffers 204 reside on one or more separate data buffer devices.

In another implementation, a centralized buffer without distributed data buffers 204 may be used but may be limited in speed due to the increased routing to the centralized buffer. Referring back to FIG. 1, the CA buffer 202 is used to buffer the RQ bus, and the distributed data buffers 204 are used to buffer the DQ bus 203. The number of distributed data buffers 204 may depend upon the number of buffered DRAM devices 206. In the depicted implementation, one distributed data buffer 112 is used per two DRAM devices 206. The CA buffer 202 may also include a data buffer for error correction codes (ECC) DRAM. Alternatively, other groupings of distributed data buffers 204 to DRAM devices 206 may be used as would be appreciated by one of ordinary skill in the art having the benefit of this disclosure.

While buffering can increase the capacity of the DIMM 200 and/or allows more DIMMs to share a memory channel, the power overhead can limit the performance of the electronic system in which the DIMM 200 is used. A data buffer device on a DIMM 200 has a primary interface coupled to the memory controller and a secondary interface coupled to the DRAM device 206. The data buffer device can isolate the secondary interface, also referred to herein as a memory interface while the primary interface may be referred to as the controller interface. Since the secondary interface can be isolated, the DRAM devices can be optimized regardless of the existing controllers and there are opportunities for power or area optimizations as described herein. The secondary interface may be point-to-point or point-to-multi-point, and the primary interface can be, e.g., stubbed for multiple DIMMs 200. The primary interface may be a strobe-based interface, such as in DDR3 and DDR4 interfaces. In one embodiment, the primary interface for the DQ bus 203 can operate at 12.8 GBps. Alternatively, the primary interface for the DQ bus 203 can operate at other speeds.

In the embodiments described herein for NVDIMMs, two or more memory types may be used where one memory type is DRAM technology, and the one or more other memory technologies are non-volatile memory (NVM) technologies. In one embodiment, two memory technologies are used, including DRAM technology and the other one of the different types of NVM technologies. In another embodiment, as illustrated in FIG. 2, three memory technologies are used, including DRAM technology, a faster NVM technology for journaling and a slower NVM technology for image storage.

Referring back to FIG. 2, the NVDIMM 200 is a three-tier memory scheme including a first memory type, a second memory type and a third memory type. The first memory type includes the volatile DRAM devices 206 described above. The second memory type includes faster NVM devices for the journal NVM devices 210, and the third memory type includes slower NVM devices for the image NVM devices 208. In one embodiment, the image NVM devices 208 are NAND flash devices and the journal NVM devices 210 are memory devices that have faster access rates than the image NVM devices 208. For example, NAND flash can be accessed for read operations in tens of microseconds (~10's μsec) and for write operations in hundreds of microseconds (~100's μsec); whereas, the journal NVM devices 210 can be accessed, e.g., for read operation in one microsecond (~1 μsec) and for write operations in two microseconds (~2 μsec). For comparison, DRAM devices 206 can be accessed in the tens of nanoseconds (~10's μsec). Thus, the journal NVM devices 210 can be other types of NVM devices that have faster access than the image NVM devices 208. For example, the image NVM devices 208 may be NAND flash, NOR flash, static RAM (SRAM), pseudo static RAM, erasable programmable read only memory (EPROM), electrically erasable programmable ROM (EEPROM), or the like, and the journal NVM devices 210 may be resistive RAM (ReRAM), magnetoresistive RAM (MRAM), phase-change memory (also referred to as PCM, PCME, PRAM, PCRAM, Obonic Unified Memory, Chalcogenide RAM and C-RAM), racetrack memory or the like. For example, ReRAM can perform access operations at 2 μsec, PCM can perform access operations at 125 nsec and MRAM can perform operations at 10's nsec.

In the FIG. 2 embodiment, the CA buffer 202 communicates with the journal NVM devices 210 over a DQ/RQ bus 207 and communicates with the image NVM devices 208 over a DQ/RQ bus 209. In one embodiment, bus 207 can operate at 1 GBps and the bus 209 can operate at 360 MBps, as compared to the first DQ bus 203 that can operate at 12.8 GBps. Additional details regarding operations of the two-tier and three-tier memory schemes are described below with respect to FIGS. 3-8.

The NVDIMM 200 can be inserted in a socket of a computer memory system. The NVDIMM, as described in various embodiments herein, may be built from standard memory components, and may be used with existing controllers in at least some embodiments. In some cases, no modifications are necessary to the existing memory controllers in order to operate with these NVDIMMs. The embodiments described herein may also be compatible with standard error detection and correction (EDC) codes. This includes standard (Hamming) ECC bit codes and standard "Chip-kill" symbol codes.

Figure 3:
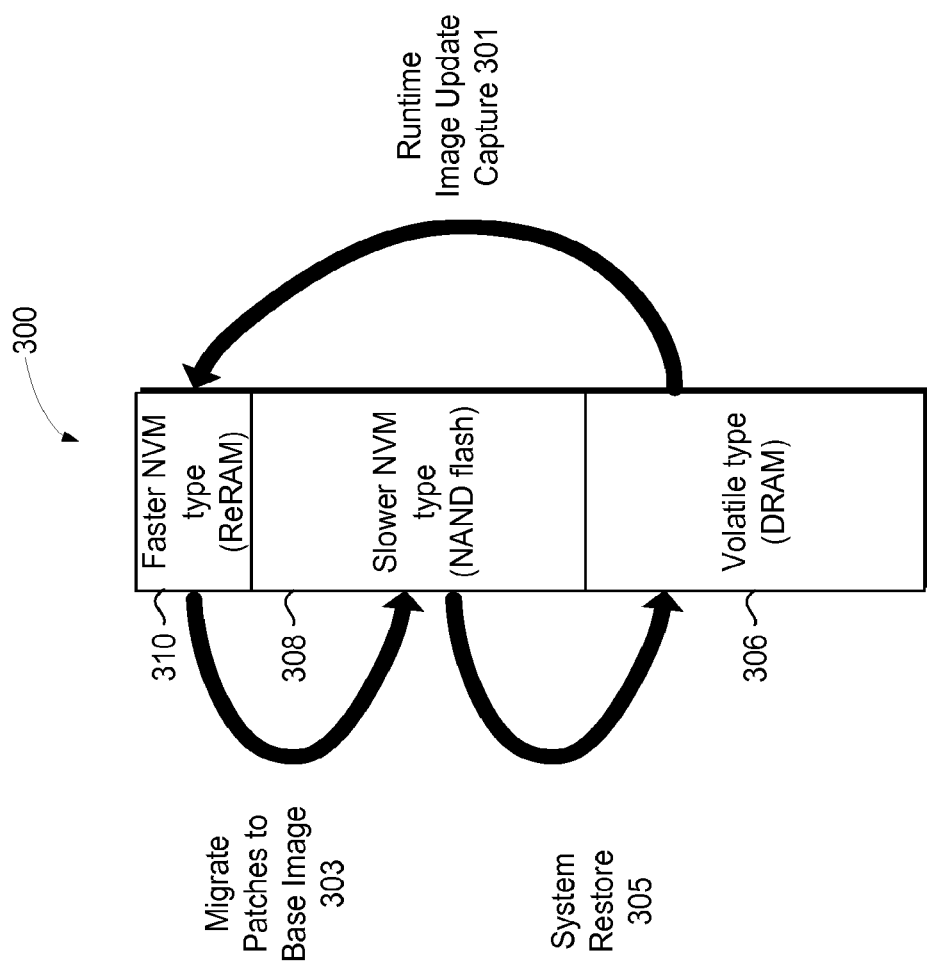
FIG. 3 shows a three-tiered memory scheme of a NVDIMM for persistent memory according to one implementation.

FIG. 3 shows a three-tiered memory scheme 300 of a NVDIMM for persistent memory (with or without auxiliary power source) according to one implementation. The three-tiered memory scheme 300 includes volatile type memory 306 (e.g., DRAM), slower NVM type 308 (e.g., NAND flash) and faster NVM type 310 (e.g., ReRAM). The faster NVM type 310 can be high endurance and high performance, compared to the slower NVM type 308, and the slower NVM type 308 can be the highest bit economy.

During operation of the NVDIMM, the CA buffer captures a runtime image update 301 of data stored in the volatile type memory 306 and stores the runtime image update 301 in the faster NVM type 310, and ultimately in the slower NVM type 308. In another embodiment, the CA buffer stores the base image directly in the slower NVM type 308. In one embodiment, the CA buffer manages the write stream as a series of linear update requests that migrate patches to the base image 303. In this manner, the CA buffer can use the faster NVM type 310 to keep up with the changes in the faster volatile type memory 306. The CA buffer can collect multiple changes before transferring to the slower NVM type 308. In one embodiment, the CA buffer tracks data changes units using journaling. The CA buffer can reclaim journal space in the faster NVM type 310 by periodically patching the base image with a logged update stream. The CA buffer can keep track of the changes before committing these changes to an original base image (or a previously updated base image). In this manner, the CA buffer divides the write stream among the multiple memory types 308, 310 to create a backup of the data stored in the volatile type memory 306 in the event of power loss.

Figure 4:
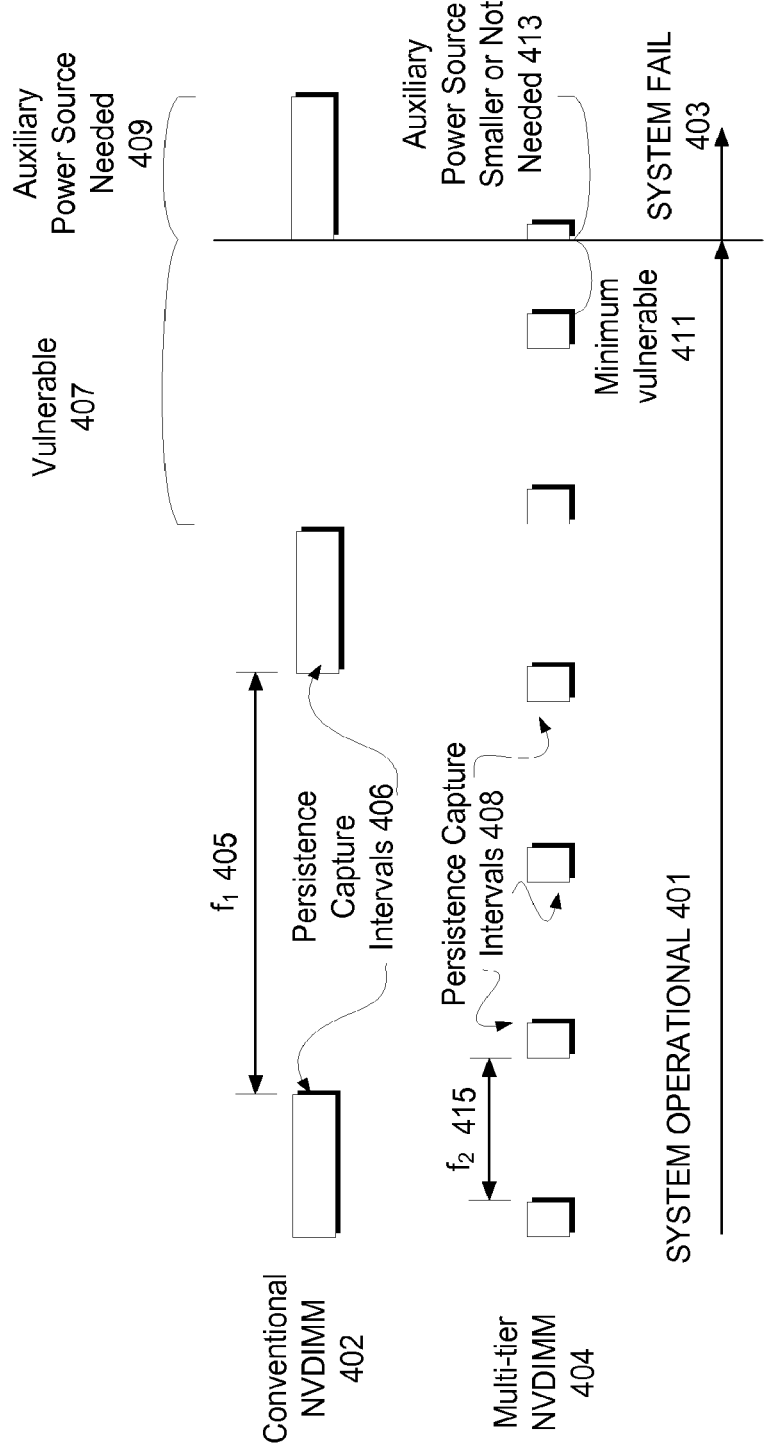
FIG. 4 is a diagram illustrating capture intervals of a conventional NVDIMM and a multi-tiered NVDIMM according to one implementation.

FIG. 4 is a diagram illustrating capture intervals of a conventional NVDIMM 402 and a multi-tiered NVDIMM 404 according to one implementation. While the memory system is operational 401, a conventional NVDIMM 402 captures all data in all DRAM devices ("snapshots") during persistence capture intervals 406 and stores the captured data as a complete image in NAND flash devices, for example. The persistence capture intervals 406 occur at a specified first frequency 405. When there is a system fail event 403, an auxiliary power source is needed 409 in order to capture all data in the DRAM devices as a new saved image. The conventional NVDIMM 402 is vulnerable during a time 407 between the last persistence capture interval 406 and the system fail event 403.

While the memory system is operational 401, a multi-tier NVDIMM 404, as described herein, captures incremental data from the DRAM devices during persistence capture intervals 408 and stores the captured data in the faster NVM type 310. The persistence capture intervals 408 occur at a specified second frequency 415 that is less than the first frequency 405, and/or opportunistically based on external DRAM traffic, as will be described below, and can include a large number of quite small capture intervals. Also, the persistence capture intervals 408 can be of shorter duration than persistence capture intervals 406 as NVDIMM 404 tracks data change units using journaling (logged update stream) and periodically patches a base image with the tracked data change units, without taking full snapshots of the DRAM contents. When there is a system fail event 403, an auxiliary power source is not needed 413 in some embodiments for the multi-tier NVDIMM 404 in order to capture data in the DRAM devices since either the faster NVM type, slower NVM type, or both store the base image and any data change units to the base image data, and has a minimal vulnerable time 411 between the last persistence capture interval 408 and the system fail event 403. As illustrated in FIG. 4, there would be zero system hold time requirement after system failure using the embodiments described herein. Also, the higher frequency updates minimizes data loss between events. Also, in some embodiments, the NVDIMM 404 can operate in a journaling mode and in a legacy snapshot mode and can switch between these modes as supported configuration modes. In the legacy mode, the NVDIMM 404 would operate as the conventional NVDIMM 402 illustrated in FIG. 4 as described above. The NVDIMM 404 can be backwards compatible in this regard, and the NVDIMM 404 can be switched between the modes through a mode switch or the like. In other embodiments, where no vulnerability can be allowed, at system fail event 403 a small auxiliary power source can power the module long enough to prevent any outstanding changes in DRAM to be captures to the journal prior to shut down.

Although not illustrated in FIG. 4, the multi-tier NVDIMM 404 can do an initial base image of the data stored in the volatile type memory 306 and eventually store the base image in the slower NVM type 308. The multi-tier NVDIMM 404 can use journaling in the faster NVM type 310 to track changes to data in the volatile type memory 306 as data change units. The multi-tier NVDIMM 404 can aggregate the data changes units for incremental updates to the base image in the slower NVM type 308. The multi-tier NVDIMM 404 can aggregate blocks to eliminate redundant writes, as well as to consider write granularity, in order to efficiently make incremental updates to the base image in the slower NVM type 308. In some embodiments, the incremental updates can occur when a certain amount of data change units are collected, after a specified amount of time has lapsed, or in response to other conditions or events. The multi-tier NVDIMM 404 can intelligently coordinate the incremental updates to the base image when bus resources are available for transfer of the incremental updates to the slower NVM type 308 in order to keep up with the data change units in the volatile type memory 306. Various techniques may be used to coordinate the persistence capture intervals 408, as well as the incremental update intervals. As discussed above, the incremental update intervals may occur asynchronously, whereas the persistence capture intervals 408 can be periodic at the second frequency 415. For example, if no incremental updates are captured during the persistence capture intervals 408, then there would be no incremental update. Also, there may be multiple data changes units captured during the persistence capture interval 408 before an incremental update occurs.

Figure 5:
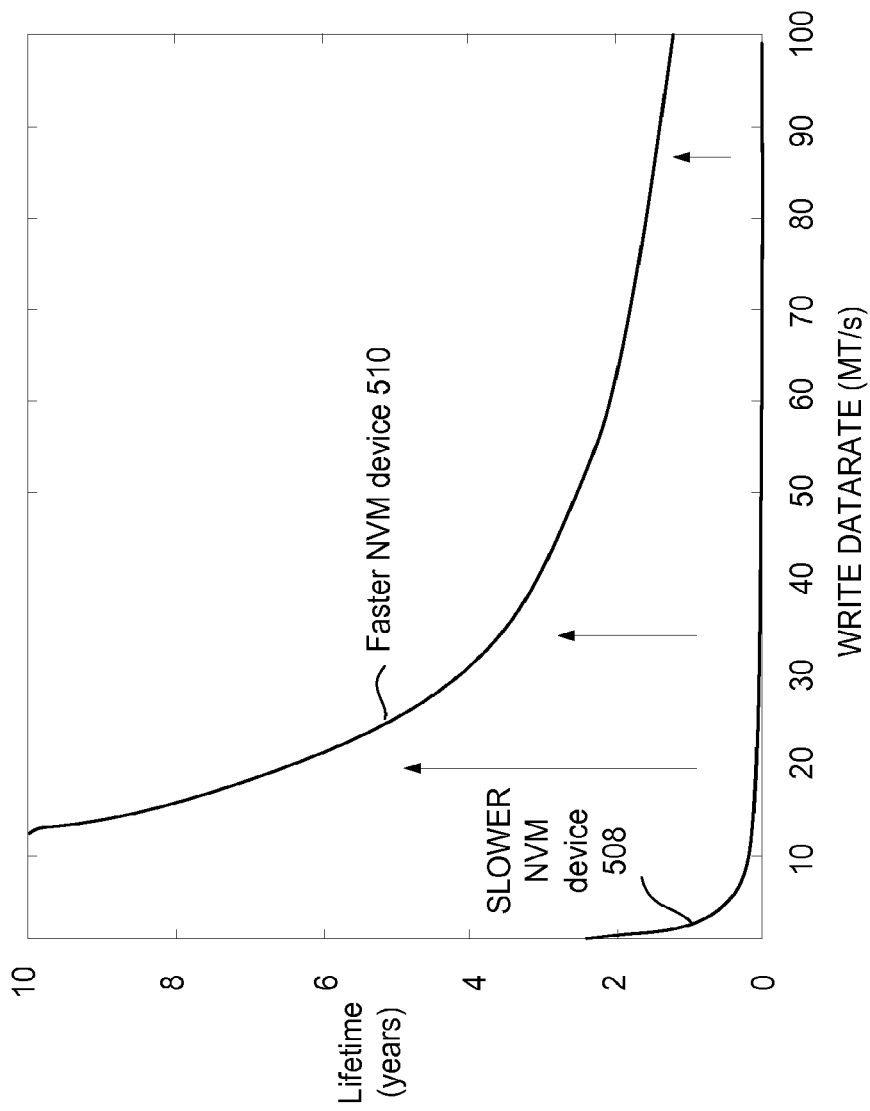
FIG. 5 is an interval distribution of write data rate over a lifetime of the NVDIMM according to one implementation.

FIG. 5 illustrates how NVDIMM lifetime is affected by both the technique used for incremental backup and the write datarate to the NVDIMM. As illustrated in FIG. 5, the embodiments of the NVDIMM described herein maximize effective NVM endurance through tiers for backing-up write operations (also referred to herein as "write tier-ing." Without the tiered approach, NVM device 508 would quickly exhaust its useful life if it attempted to capture incremental backup for even a relatively slow NVDIMM write datarate. By using the faster journal memory 510, however, to insulate the slow NVM from full write traffic, the device can offer, e.g., a 5-year life with a sustained write rate of over 20 MT/s.

Figure 6:
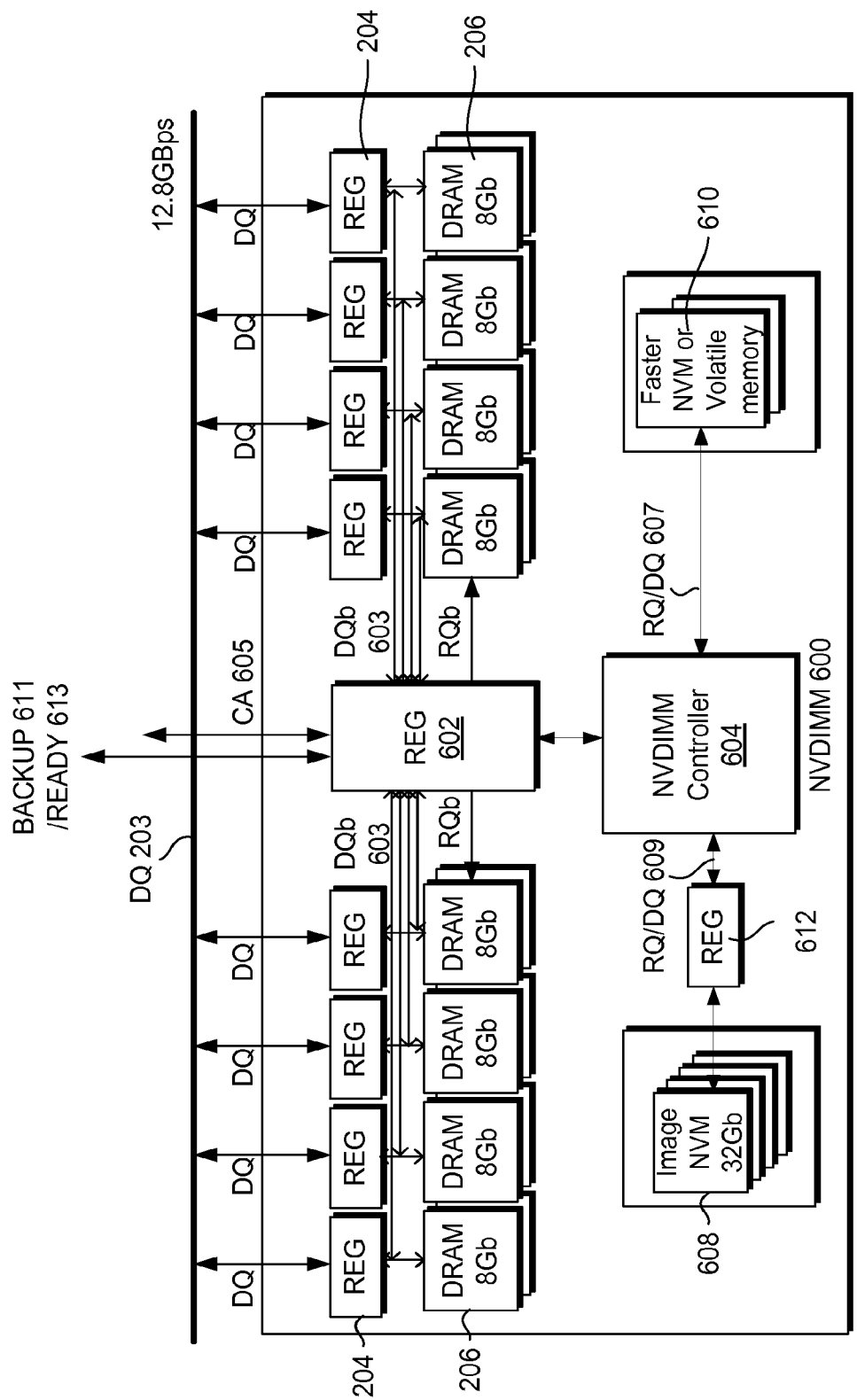
FIG. 6 is a block diagram of a NVDIMM with a two-tiered memory scheme or three-tiered memory scheme for persistent memory according to another implementation.

FIG. 6 is a block diagram of a NVDIMM 600 for persistent memory (with or without auxiliary power source) according to another implementation. The NVDIMM 600 is similar to the NVDIMM 200 as noted by similar reference numbers, except where specifically noted. In this embodiment, a buffer 602 (labeled REG) is used between the CA bus 605 and a NVDIMM controller 604. The buffer 602 can coordinate access to the DRAM devices 206 in order to track data change units for journaling by the NVDIMM controller 604. In some embodiment, the buffer 602 can capture a state of the DRAM devices 206 by tracking data on the DQ bus 203, such as by receiving the data signals on the 72 lines of the DQ bus 203 going to the DRAM devices 206 from the distributed data buffers 204. In other embodiments, the state of the DRAM devices 206 can be tracked by accessing the DRAM devices 206 via a secondary DQ bus 603 (DQb)). In some embodiments, the NVDIMM controller 604 tracks the state of the DRAM devices 206 by capturing, at a minimum, addresses of write accesses to the DRAM devices 206. Using the addresses, the NVDIMM controller 604 can later access the DRAM devices 206 to obtain any changes made to the DRAM devices 206 as the data change units. Alternatively, the NVDIMM controller 604 may be able to capture the state using both the addresses and the actual data on the DQ bus 203, as described herein, depending on the write rate required by the host.

In this embodiment, the NVDIMM controller 604 coordinates capturing data to be stored persistently. The NVDIMM controller 604, like the CA buffer 202 can create a base image of a state of the DRAM devices 206 and store the base image in the slower NVM type 608 over a bus 609. A buffer 612 can also be used between the slower NVM type 608 and the NVDIMM controller 604. The NVDIMM controller 604 also performs the journaling to track data change units in the state of the DRAM devices 206. The NVDIMM controller 604 tracks the data change units using memory 610, which is either faster NVM type or volatile type memory. When using the faster NVM type memory for memory 610, there are three types of memories being used for the NVDIMM 600. For example, DRAM devices can be used for volatile memory type, NAND flash devices can be used for the slower NVM type 608 and ReRam or MRAM devices can be used for the faster NVM type 610. In some embodiments of two-tier memory schemes, the different types of slower and faster NVM memory types can be used for the memory 608, but the slower NVM memory types may be more economical on a cost per bit basis.

When using the volatile type memory for memory 610, there may be only two types of memories being used for the NVDIMM 600, where volatile memory can be used for non-persistent memory and journaling, and non-volatile memory can be used for restoring the data in the event of power loss. It should be noted that in these embodiments of two memory types and journaling, an auxiliary power source may still be needed in the event of power failure. However, because of journaling, only the volatile memory used for journaling would need to be copied before shutdown. This may result in smaller auxiliary power sources needed to power the NVDIMM in the event of power loss. For example, the base image would be stored in the non-volatile memory type and only the incremental updates stored in the volatile memory type used for journaling would need to be accessed to obtain the latest incremental updates to the base image. Also, as described with respect to FIG. 4, the time of vulnerability is shorter with NVDIMM 600 because the persistence capture intervals 408 occur more frequently than the persistence capture intervals 406 because only the incremental updates need to be captured during the persistence capture intervals 408 and not the entire state of the DRAM devices as done in the persistence capture intervals 406.

In further embodiments, the NVDIMM controller 604 may perform other operations to aggregate incremental updates, such as to eliminate redundant writes and to reduce write granularity for longevity of the slower non-volatile memory type 608.

In some embodiments, the backup operations performed by the NVDIMMs can be initiated by a memory controller (or other external component). For example, as illustrated in FIG. 6, the memory controller (not illustrated) sends a backup signal 611 to the NVDIMM 604 to put the NVDIMM 604 in a configuration mode in which a state of the DRAM devices on the NVDIMM 604 can be stored persistently. The NVDIMM 604 can perform any necessary initialization operations to prepare for storing a copy of the state of the DRAM devices 206 in the NVM of the NVDIMM 600. For example, the NVDIMM controller 604 can access the DRAM devices 206 to capture a snapshot image of the data (also referred to herein as a base image) and store the snapshot image in the slower NVM type 608. During these operations, the DRAM devices 206 may be unavailable for further accesses on the DQ bus 203 to ensure coherency in the snapshot image. Once the initialization operations are performed, the NVDIMM 600 can send a ready signal 613 back to the memory controller.

The NVDIMM 600 can be configured as a two-tiered memory scheme or three-tiered memory scheme based on the memory type selected for memory 610. In a two-tiered memory scheme, instead of using a journal NVM type memory 210, volatile memory type can be used to capture and store the incremental updates before the incremental updates are transferred to the slower NVM memory type 608. In this embodiment, the volatile memory type can be the same type of memory used for non-persistent memory of the NVDIMM. For example, the memory type 610 may be DRAM device(s). In a three-tiered memory scheme, the faster NVM type 610 (like journal NVM type 210) can be used to capture, store and transfer the incremental updates to the base image in the slower NVM type 608.

Although illustrated as separate components 608, 612, 604, and 610, these components can be integrated on the same package or multiple packages.

Figure 7:
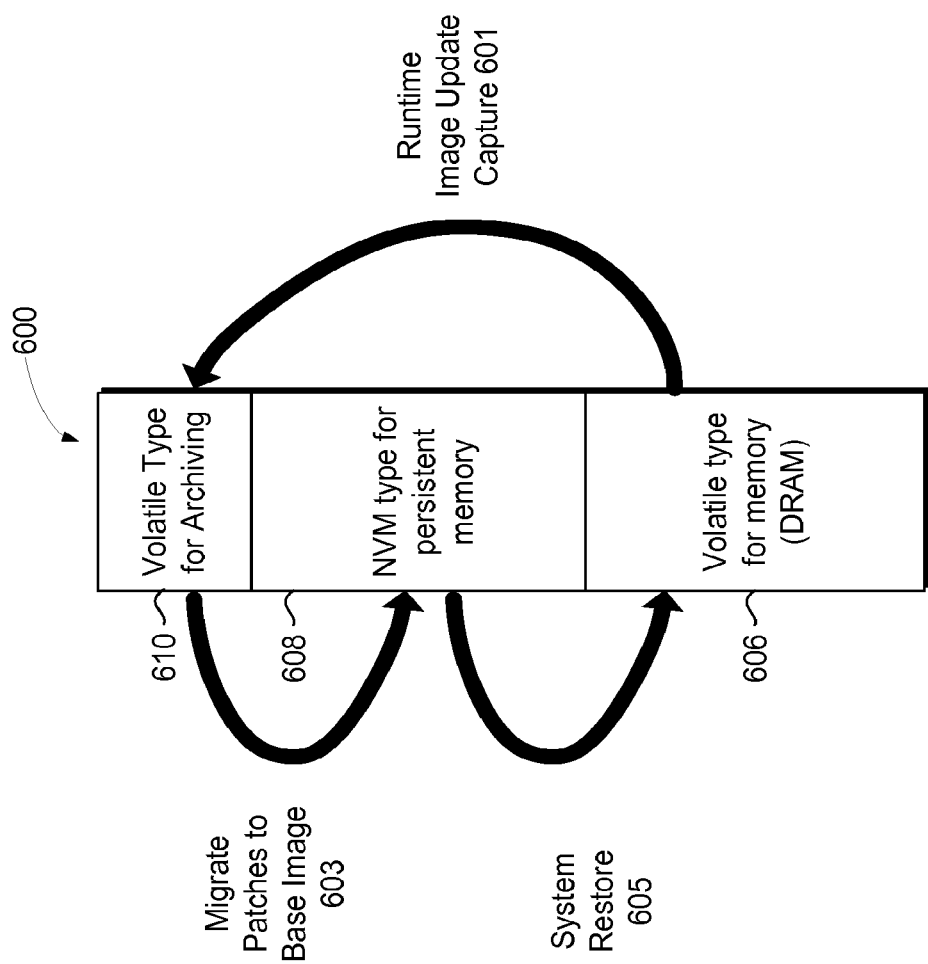
FIG. 7 shows a two-tiered memory scheme of a NVDIMM for persistent memory according to another implementation.

FIG. 7 shows a two-tiered memory scheme 700 of a NVDIMM for persistent memory (with or without auxiliary power source) according to another implementation. The two-tiered memory scheme 700 includes volatile type memory (e.g., DRAM) for volatile memory 606 and for archiving 610 the volatile memory and NVM type 608 (e.g., NAND flash or even faster NVM types) for persistent memory. For example, one or more additional DRAM devices can be used for the memory 610 for journaling and transferring incremental updates to the NVM type memory 608 as described herein.

During operation of the NVDIMM with the two-tiered memory scheme 700, the NVDIMM controller (or CA buffer) captures a runtime image update 601 of data stored in the volatile type memory 606 and stores the runtime image update 601 in the volatile type 610, and ultimately in the NVM type memory 608. In another embodiment, the NVDIMM controller (or CA buffer) stores the base image directly in the NVM type memory 608. In one embodiment, the NVDIMM controller (or CA buffer) manages the write stream as a series of linear update requests that migrate patches to the base image 603. In this manner, the NVDIMM controller (or CA buffer) can use the volatile type memory 610 to keep up with the changes in the volatile type memory 606. The NVDIMM controller (or CA buffer) can collect multiple changes in the volatile type 610 before transferring to the NVM type memory 608. In one embodiment, the NVDIMM controller (or CA buffer) tracks data changes units using journaling. The NVDIMM controller (or CA buffer) can reclaim journal space in the volatile type 610 by periodically patching the base image with a logged update stream. The NVDIMM controller (or CA buffer) can keep track of the changes before committing these changes to an original base image (or a previously updated based image). In this manner, the NVDIMM controller (or CA buffer) creates a backup of the data stored in the volatile type memory 606 in the event of power loss. As described above, an auxiliary power source may still be needed in the event of power loss, but the auxiliary power source may be smaller than those used in the conventional solutions because only the incremental changes stored in the volatile type memory 610 need to be copied to restore the state.

Figure 8:
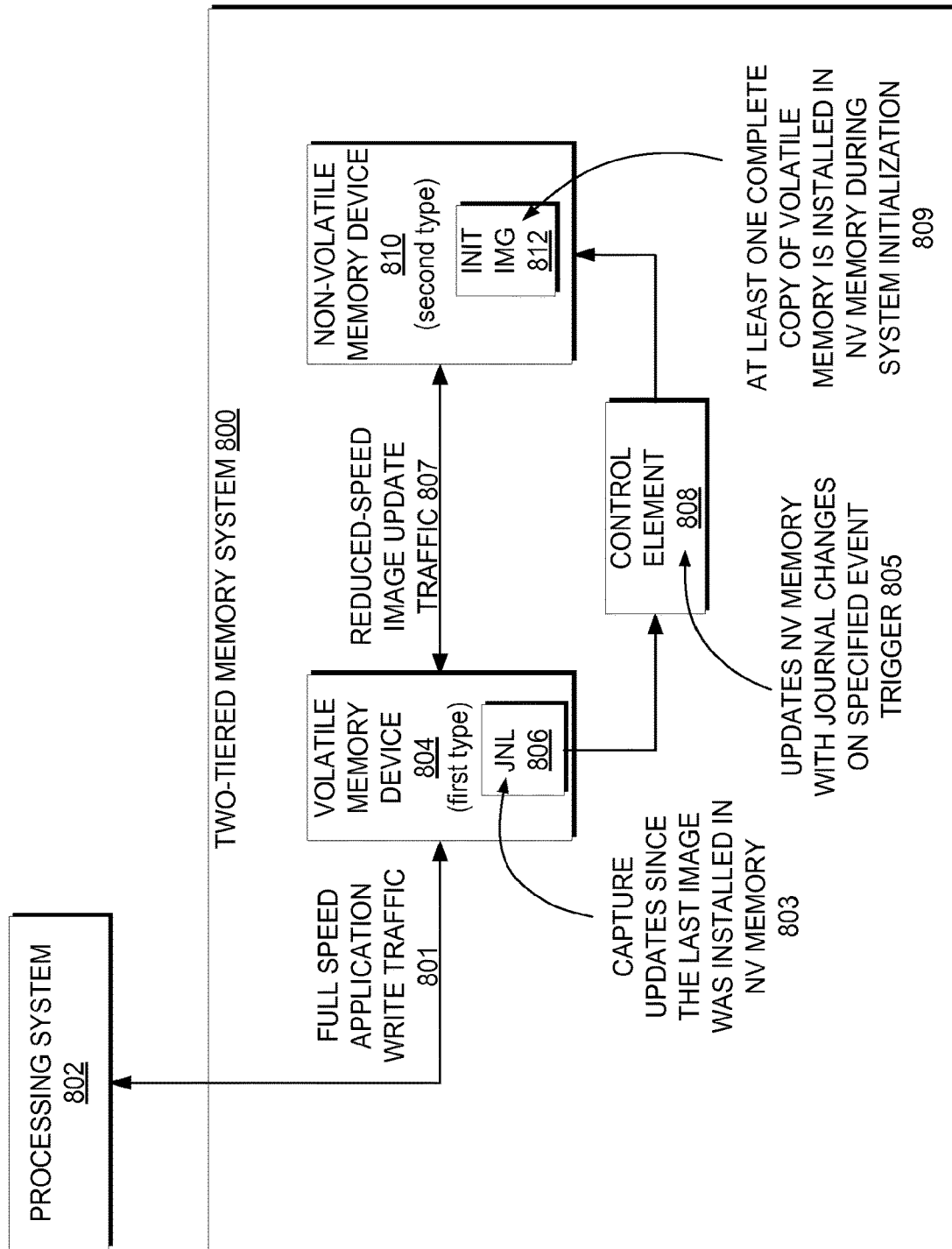
FIG. 8 is a block diagram of a two-tiered memory system including a first memory type and a second memory type according to one implementation.

FIG. 8 is a block diagram of a two-tiered memory system 800 including a first memory type and a second memory type according to one implementation. The two-tiered memory system 800 includes a volatile memory device 804 that is the first memory type and a non-volatile memory device 810 that is the second memory type. The first memory type is volatile, high speed and high endurance. For example, the first memory type can be a DRAM device, an SRAM device, or the like. The second memory type is non-volatile, lower speed and lower endurance than the first memory type. The second memory type also has a lower bit cost. For example, the second memory type can be a NAND flash device, a MRAM device, a ReRAM device (PCM, CBRAM), or the like. The non-volatile memory device 810 may be the same capacity as the volatile memory device 804 or larger. It should be noted that the memory devices 804, 810 may include one or more memory devices disposed in various packaging configurations.

The volatile memory device 804 handles full-speed application write traffic with a processing system 802. In the two-tiered memory system 800, a journal of updates 806 can be stored in the volatile memory device 804. The journal of updates 806 may be a log of write data, a log journal of address of write operations to capture the write data from address locations, a dirty page map, or some combination thereof. The journal of updates 806 may be a compressed stream of write data. The updates since the last image was installed in the non-volatile memory device 810 can be captured 803 for the journal of updates 806. An initial image 812 is stored in the non-volatile memory device 810 as described below. A control element 808 (e.g., CA buffer 202, NVDIMM controller 604) can be used to trigger a transfer of journal updates 806 to the non-volatile memory device 810 based on time, exceeding log capacity, high water mark, or in response to a signal or command from the processing system 802. At least one complete copy of volatile memory is installed in non-volatile memory device 810 during system initialization 809 (or during initialization of archiving feature of NVDIMM. A complete image can also be written at any time at the processing system's request. In some embodiments, a complete image can be created during power on using an image from a previous session and applying updates stored in non-volatile memory device 810 using allocated update space. The non-volatile memory device 810 receives reduced-speed image update traffic 807 from the volatile memory device 804 in order to install the initial image 812 or to update the initial image 812 with the journal updates 806.

It should be noted that the two-tiered memory system 800 may be a separate device than the processing system 802 or may be embedded in the same device as the processing system 802. The two-tiered memory system 800 can be a standalone module with connector and electrical interface. The two-tiered memory system 800 can be part of an assembly attached to the processing system 802 using a cable, a network, or a wireless connection. Alternatively, the two-tiered memory system 800 can be used in other computer memory configurations.

In one embodiment, the two-tiered memory system 800 includes a first interface to couple to the first volatile memory device 804, a second interface to couple to the second non-volatile memory device 810, and a third interface to couple to a third memory device of the first memory type (volatile memory) (not illustrated in this manner in FIG. 8). The control element 808 is coupled to the first interface, second interface and third interface. The control element 808 is to capture a state of data stored in the first memory device 804 over the first interface and transfer the state to the second memory device 810. The second memory device 810 is to store the state for recovery in the event of power loss. The control element 808 is also to track data change units representing changes to the state of data stored in the first memory device 804 and aggregate the data change units in the third memory device. The control element 808 is to transfer the data change units to the second memory device 810. The state stored in the second memory device 810 is updated with the transferred data change units.

In a further embodiment, the control element 808 is further to restore the state stored in the second memory device 810 in response to loss of power. The control element 808 may trigger a journal of updates to track the data change units. The journal updates can be stored in the third memory device (first memory type) (e.g., JNL 806). In one embodiment, the first memory device 804 is coupled to a data bus (e.g., 801) and the control element 808 is to initiate the transfer of the state and the data change units to the second memory device 810 via a second data bus (e.g., 807) between the first memory device 804 and the second memory device 810. The second data bus has lower speed than the first data bus.

Figure 9:
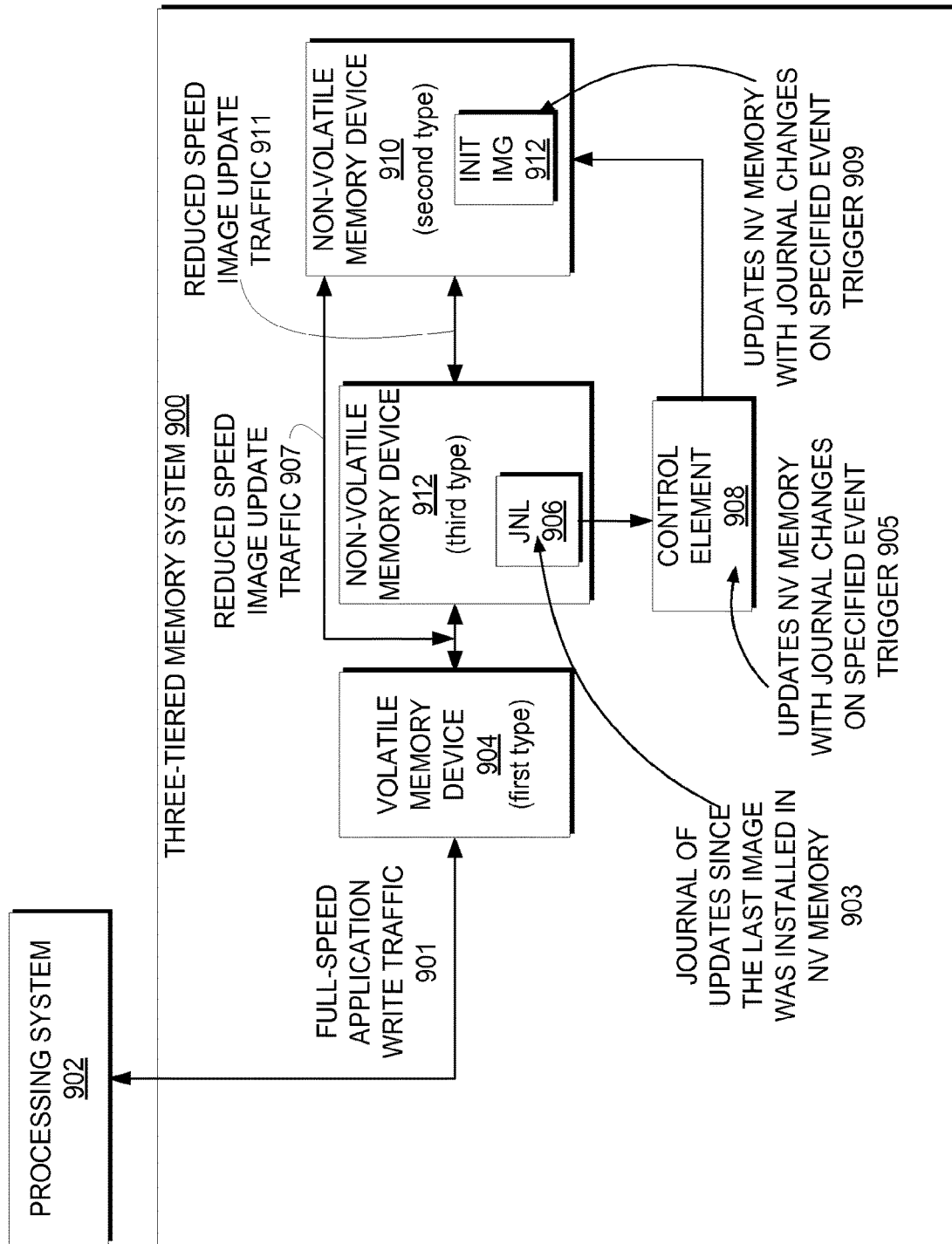
FIG. 9 is a block diagram of a three-tiered memory system including a first memory type, a second memory type and a third memory type according to one implementation.

FIG. 9 is a block diagram of a three-tiered memory system 900 including a first memory type, a second memory type and a third memory type according to one implementation. The three-tiered memory system 900 includes a volatile memory device 904 that is the first memory type, a non-volatile memory device 910 that is the second memory type, and a non-volatile memory device 912 that is the third memory type. The first memory type is volatile, high speed and high endurance. For example, the first memory type can be a DRAM device, an SRAM device, or the like. The second memory type is non-volatile, lower speed and lower endurance than the first memory type. The second memory type also has a lower bit cost. For example, the second memory type can be a NAND flash device. The non-volatile memory device 910 may be the same capacity as the volatile memory device 904 or larger. The third memory type is non-volatile, higher speed and higher endurance than the second memory type, but may be lower speed and lower endurance than the first memory type. The third memory type also has a medium bit cost that is lower than the second memory type, but possibly higher than the first memory type. For example, the third memory type can be a MRAM device, a ReRAM device (PCM, CBRAM), or the like. The non-volatile memory device 912 may be the same capacity as the volatile memory device 904, smaller, or larger. It should be noted that the memory devices 804, 810 may include one or more memory devices disposed in various packaging configurations.

The volatile memory device 904 handles full-speed application write traffic with a processing system 902. In the three-tiered memory system 900, a journal of updates 906 can be stored in the non-volatile memory device 912 (instead of the volatile memory device 904 in the two-tiered memory system 800). The journal of updates 906 may be a log of write data, a log journal of address of write operations to capture the write data from address locations, a dirty page map, or some combination of these. The journal of updates 906 may be a compressed stream of write data. The updates since the last image was installed in the non-volatile memory device 910 can be captured 903 for the journal of updates 906. An initial image 912 is stored in the non-volatile memory device 910. A control element 908 (e.g., CA buffer 202, NVDIMM controller 604) can be used to trigger a transfer of journal updates 906 to the non-volatile memory device 910 based on time, exceeding log capacity, high water mark, or in response to a signal or command from the processing system 902. At least one complete copy of volatile memory is installed in non-volatile memory device 910 during system initialization 909 (or during initialization of the archiving feature of NVDIMM). A complete image can also be written at any time at the processing system's request. In some embodiments, a complete image can be created during power-on using an image from a previous session and applying updates stored in non-volatile memory device 910 using allocated update space. The non-volatile memory device 910 receives reduced-speed image update traffic 907 from the volatile memory device 904 or reduced-speed image update traffic 911 from the non-volatile memory device 912 in order to install the initial image 912 or to update the initial image 912 with the journal updates 906.

It should be noted that the three-tiered memory system 900 may be a separate device than the processing system 902 or may be embedded in the same device as the processing system 902. The three-tiered memory system 900 can be a standalone module with connector and electrical interface. The three-tiered memory system 900 can be part of an assembly attached to the processing system 902 using a cable, a network, or a wireless connection. Alternatively, the three-tiered memory system 900 can be used in other computer memory configurations.

In one embodiment, the three-tiered memory system 800 includes a first interface to couple to the first volatile memory device 904, a second interface to couple to the second non-volatile memory device 910, and a third interface to couple to the third memory device 912 (faster non-volatile memory type). The control element 908 is coupled to the first interface, second interface and third interface. The control element 908 is to capture a state of data stored in the first memory device 904 over the first interface and transfer the state to the second memory device 910. The second memory device 910 is to store the state for recovery in the event of power loss. The control element 908 is also to track data change units representing changes to the state of data stored in the first memory device 904 and aggregate the data change units in the third memory device 912. The control element 908 is to transfer the data change units to the second memory device 910 from the third memory device 912. The state stored in the second memory device 910 is updated with the transferred data change units.

In a further embodiment, the control element 908 is further to restore the state stored in the second memory device 910 in response to loss of power. The control element 908 may trigger a journal of updates to track the data change units. The journal updates can be stored in the third memory device 912 (faster non-volatile memory type) (e.g., JNL 906). In one embodiment, the first memory device 904 is coupled to a data bus (e.g., 9091) and the control element 908 is to initiate the transfer of the state and the data change units to the second memory device 910 via a second data bus (e.g., 911) between the third memory device 912 and the second memory device 910. The second data bus has lower speed than the first data bus.

In another embodiment, the first memory device 904 is coupled to a first data bus 901 and the control element 908 is to initiate the transfer of the state to the second memory device 910 via a second data bus 907 between the first memory device 904 and the second memory device 910 and to initiate the transfer of the data change units to the second memory device 910 via a third data bus 911 between the third memory device 912 and the second memory device 910. The second data bus 907 and third data bus 911 have lower speeds than the first data bus 901.

In another embodiment, the first memory device 904 is coupled to a first data bus 901 and the control element 908 is to initiate the capturing of the state by the third memory device 912 over a second data bus 907 coupled between the third memory device 912 and the first memory device 904. The control element 908 is to initiate the transfer of the state and data change units to the second memory device 910 via a third data bus 911 between the third memory device 912 and the second memory device 910. The second data bus 907 and third data bus 911 have lower speeds than the first data bus 901.

Figure 10:
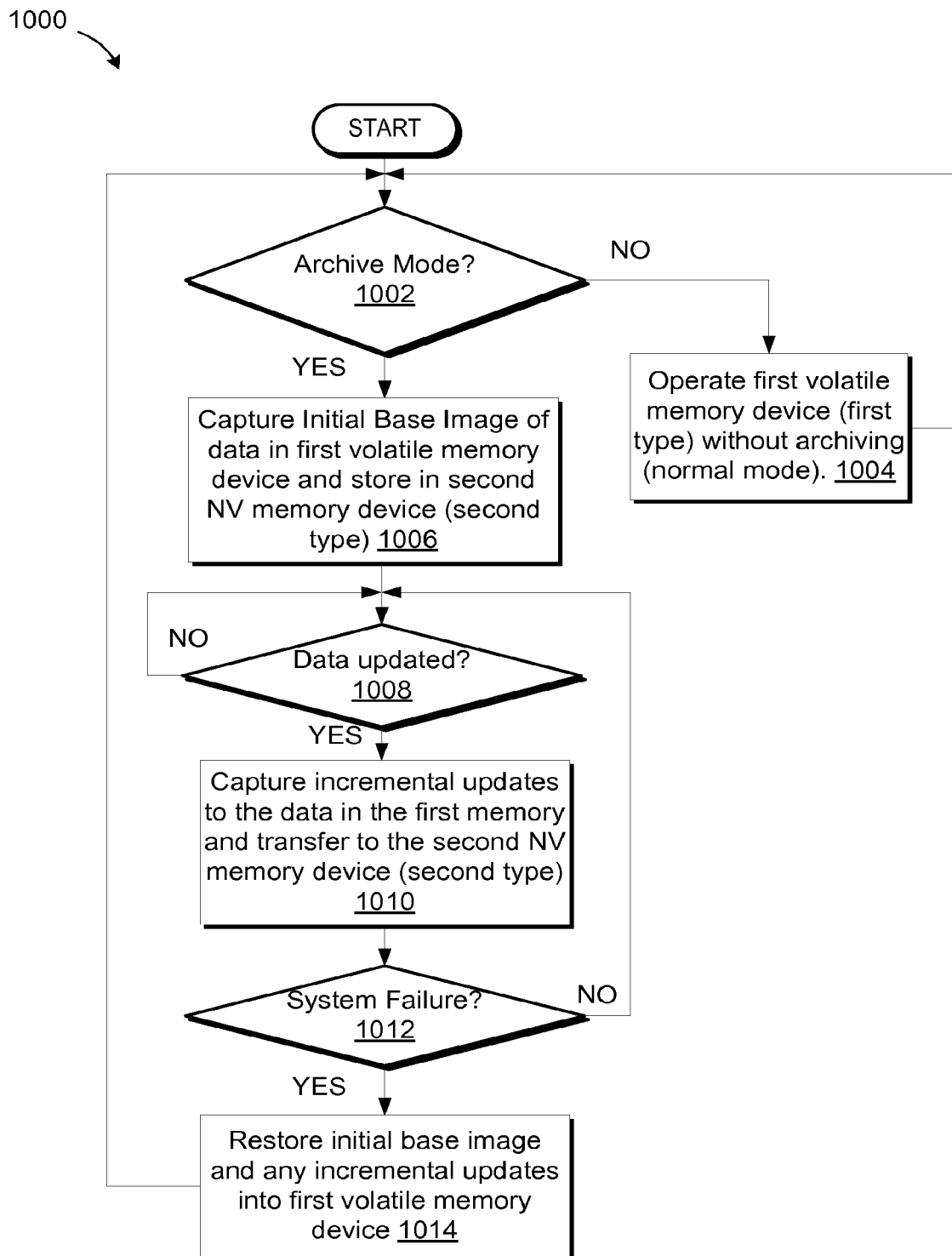
FIG. 10 is a flow diagram of a method of operating a multi-tiered NVDIMM according to an embodiment.

FIG. 10 is a flow diagram of a method 1000 of operating a multi-tiered NVDIMM according to an embodiment. The method 1000 may be performed by processing logic that may comprise hardware (e.g., circuitry, dedicated logic, programmable logic, microcode, etc.), software (such as instructions running on a processor), firmware or a combination thereof. In one embodiment, CA buffer 202 of FIG. 2 performs method 1000. In another embodiment, NVDIMM controller 604 of FIG. 6 performs the method 1000. In another embodiment, the method 1000 is performed by control element 808 or 908 of FIG. 8 or 9. Alternatively, other components of a computing system may perform some or all of the operations of the method 1000.

Referring back to FIG. 10, the method 1000 begins with determining whether a multi-tier memory system is to operate in an archive mode (block 1002). The multi-tier memory system includes one or more memory devices of a first memory type and one or more memory devices of at least a second memory type. For example, a processing system can send a command to initialize an archiving mode of the multi-tier memory system in which the multi-tier memory system stores a backup of the data in non-volatile memory in the multi-tier memory system. The multi-tier memory system can receive the command from the processing system to archive a state of data stored in the one or more memory devices of the first memory type in the one or more memory devices of the second memory type. In another embodiment, the multi-tier memory system may be in archive mode at power up. If the multi-tier memory system is not in the archive mode at block 1002, the processing logic operates in a normal mode where the first volatile memory device (first memory type) without archiving (block 1004), and returns to block 1102. If the processing logic determines that the multi-tier memory system is in archive mode at block 1002, the processing logic captures an initial base image of data in the first volatile memory device and stores the initial base image in a second non-volatile (NV) memory device (second memory type) (block 1006). After the initial base image is stored in the second NV memory device, the multi-tier memory system can notify a processing system that it is ready for archiving mode and starts to track incremental updates to data in the first volatile memory device. For example, the processing logic can perform journaling to track updates to the data. The processing logic determines if the data is updated (block 1008). If there have been updates to the data, the processing logic captures incremental updates to the data and transfer the second NV memory device (block 1010). The processing logic can transfer the incremental updates based on time, based on exceeding log capacity, based on exceeding a high mark or threshold, or in response to processing system requests.

The processing logic can determine when there is a system failure (block 1012). Until there is a system failure at block 1012, the processing logic continues to track incremental updates to the data in the first volatile memory device at block 1008 and capturing and transferring the incremental updates to the second NV memory device at block 1010. When there is a system failure at block 1012, the processing logic restores the initial base image and any incremental updates into the first volatile memory device (block 1014), and returns to block 1002 (note that if not all state has been saved at the time of system failure, the NVDIMM may stay up until all state has been saved, power down, and then wait for system resume before proceeding to block 1014). The processing logic can restore the initial base image stored in the second NV device (second memory type) along with any incremental updates stored in either the second NV device (second memory type) or in a third NV device (a third memory type that is faster than the second memory type), as described herein with respect to the two-tiered memory systems and three-tiered memory systems. When three memory types are used in a three-tiered memory system, the processing logic can capture the incremental updates and store them in the third memory type and transfer the incremental updates to the second memory type based on time, based on exceeding log capacity, based on exceeding a high mark or threshold, or in response to processing system requests.

In other embodiments, a complete image of the data in the first volatile memory device (first memory type) can be captured during system initialization, in response to a processing system request, or during power on using an image from a previous session and any updates stored in NV using allocated update space as described herein.

System Elements—a Detailed DRAM/NAND Embodiment

Figure 12:
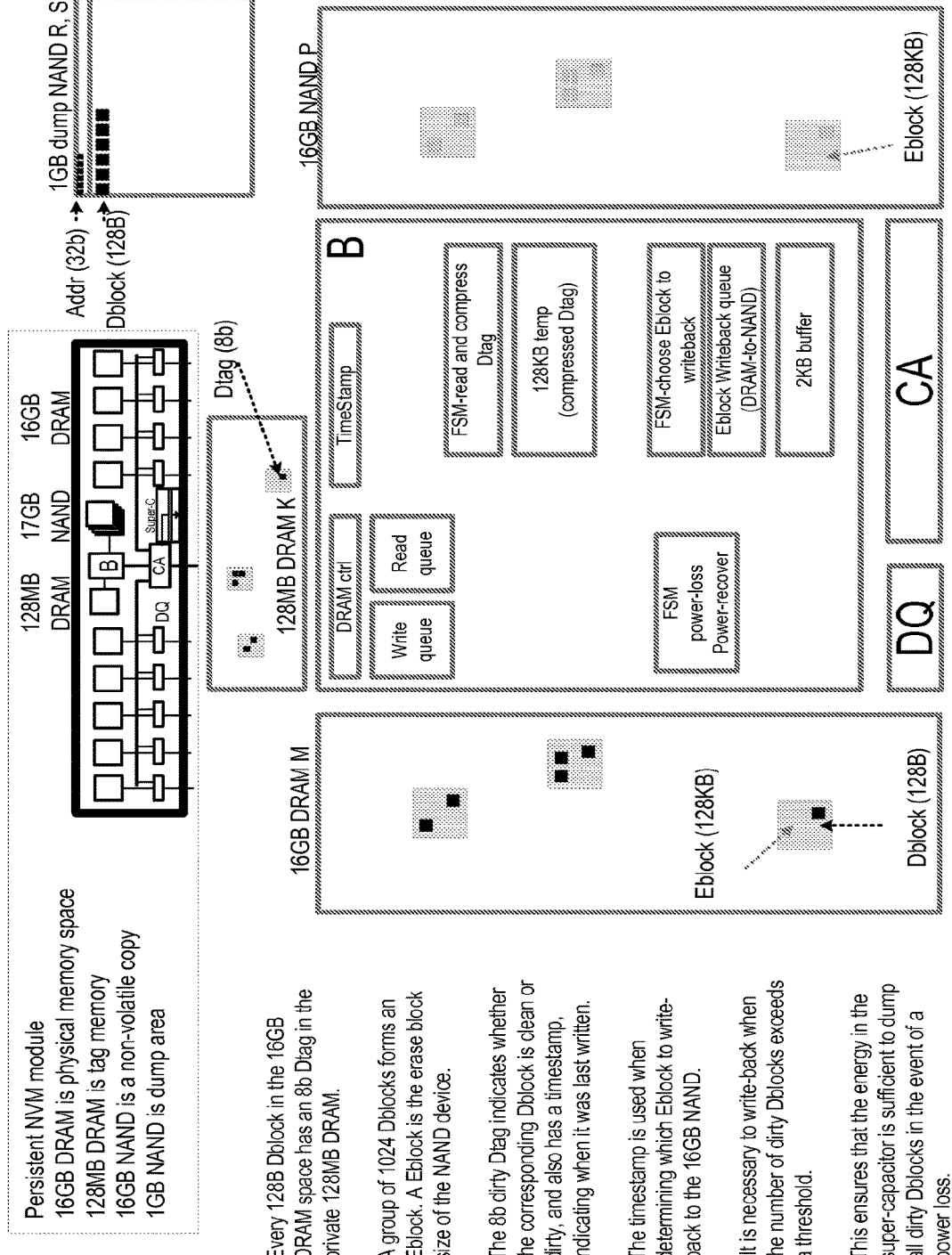
FIG. 12 shows further details of the incremental-state-capture embodiment of FIG. 11.

FIG. 12 shows an overview of a first detailed embodiment that employs standard DRAM and NAND FLASH memory devices. This solution provides a method of tracking state differences between 16 GB DRAM and 16 GB NAND Flash memories, and dumping the differential state into another region of the NAND memory. One potential advantage of this approach is that it can allow full bandwidth usage of the main memory channel without overflow or loss of state in the non-volatile mechanism, as may occur in some of the earlier embodiments if the main memory write bandwidth is not throttled appropriately. In this embodiment, high write demand by the host may put the nonvolatile portion under stress such that, if a power event were to occur after a period of unusual high write demand, the NVDIMM may not have enough reserve power to complete a full incremental state save upon power loss. If this risk is acceptable, however, and there is a corresponding following period of lower write activity, the NVDIMM can always catch back up, as will be illustrated below. If the risk of an ill-timed power failure is not acceptable, some write bandwidth throttling should be implemented to alert the host if it is dangerously close to placing the background state storage process into an "unprotected" deficit.

The FIG. 12 embodiment, like earlier described embodiments, will also move blocks from the 16 GB DRAM (M) to the 16 GB NAND (P), so that the differential state will change over time. This movement is a process called writeback. The writeback process in this embodiment is kept relatively simple for clarity.

The writeback process is improved in a second embodiment, from the standpoint of required bandwidth and wear rate of the NAND device(s). This embodiment will be shown later in the application, starting with FIG. 21.

In FIG. 12, a Dblock is a 128B transfer block (e.g., the cache line size of the system, as previously discussed). This is the size that can be sequentially written (or read) to the DRAM memory component by the host. This will be the block size used for the dump process.

An Eblock is a 128 KB erase block (1024×bigger than the Dblock)—this is the minimum size that can be randomly written to the NAND memory component (to write only a portion of an Eblock, one must read and buffer the entire Eblock, erase it, and then write the Eblock contents back, with the changed portion replaced during the write). This will be the block size used for the writeback process in the first detailed embodiment. The second detailed embodiment will reduce the writeback granularity to 128B by using sequential writes to NAND rather than random writes.

Note that the random read block granularity is 2 KB for the NAND memory component—however, this intermediate size (the NAND page size) does not help improve the dumping and writeback processes—their efficiency is determined by the erase/write granularity—either random or sequential.

Every 128B Dblock in the 16 GB DRAM space M has a corresponding 8b Dtag in a private 128 MB DRAM K. This 128 MB DRAM space K is formed from one or more additional DRAM components on the module.

In the preferred embodiment, these extra components K would have the same bank and rank organization as the primary DRAMs of the module (forming the 16 GB space M). The timing of the extra devices would be identical to that of the primary DRAMs. In other embodiments in which the extra DRAMs are organized differently from the DRAMs of M, the local DRAM control logic (on the B component in the figure) would have to issue write operations to the 128 MB DRAM K in a separately optimized command stream.

A group of 1024 Dblocks forms an Eblock. A Eblock is the erase block size of the NAND device.

The 8b dirty Dtag indicates whether the corresponding Dblock is clean or dirty, and also has a timestamp, indicating when it was last written.

The timestamp is used when determining which Eblock to writeback to the 16 GB NAND P.

It is necessary to writeback an Eblock when the number of dirty Dblocks it contains exceeds some count threshold or when the age of the Dblocks exceeds some time threshold, or when some combination of these criteria is met.

Writebacks are performed to keep the total number of dirty Dblocks in the 16 GB DRAM M below some other count threshold. This ensures that the energy in the supercapacitor is sufficient to dump all dirty Dblocks in the event of a power loss. In some embodiments, the host may be allowed to temporarily exceed this threshold; in others, the NVDIMM may be expected to alert the host to stop writing to the NVDIMM while the writeback process catches up to a safe backlog level.

Write Transactions

Figure 13:
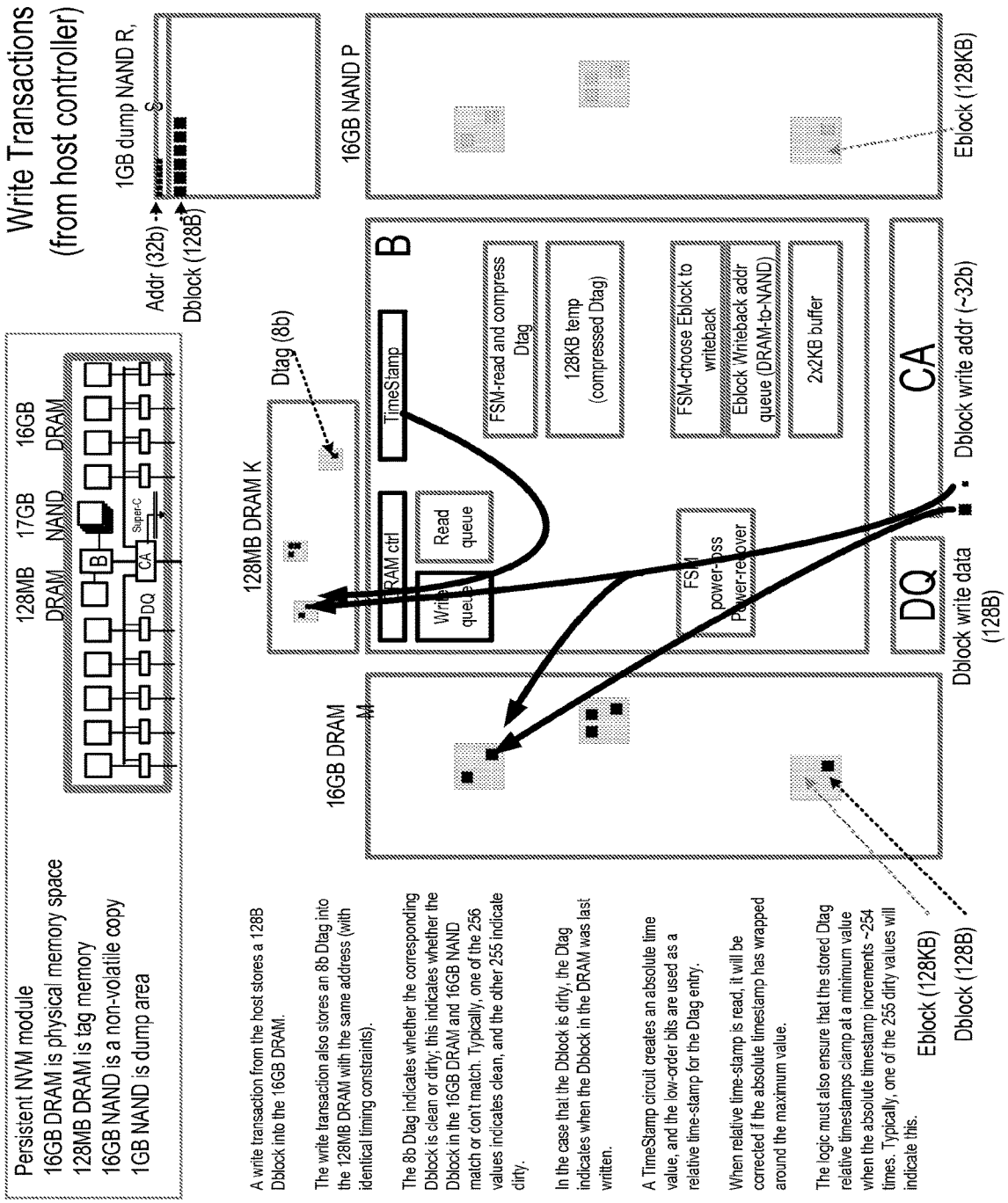
FIG. 13 illustrates, for the configuration of FIG. 12, module activities corresponding to a host write to DRAM.

A write transaction from the host involves the transfer of an address (~32b) and a block of write data (128B). This information is received at the primary interface of the module (the buses at the bottom of the module diagram at the top of FIG. 13).

The primary interface of the module connects to the CA buffer component and the nine DQ buffer components (each handling 8 of the 72 primary DQ links).

The CA and DQ buffers retransmit the address and write data onto secondary CA ad DQ links, which connect to the DRAM components forming the 16 GB memory space M.

There is an additional private bus which connects the CA buffer to the nine DQ buffers. This can be used for control purposes, but in this application it will be extended to support data transfer operations.

This private bus will be used in the mechanism for the dump transfer and the writeback transfer. The private bus will typically have a lower transfer bandwidth than the primary and secondary DRAM buses, but preferably it will be as fast as the write bandwidth of the NAND components, and thus will not limit the performance of the dump and writeback processes.

DRAM components and CA and DQ buffers are utilized in typical reduced-load memory module configurations. This application will add additional components, to be described in the next paragraphs, and/or add extended functions to normal CA/DQ buffer functions, in order to allow incremental state capture to persistent memory.

In one configuration, a new buffer component B is used to control new functions on the module. Buffer component B contains control logic for managing the 17 GB of NAND memory (R, S, and P) and the 128 MB of DRAM K that are not visible to the host system. It also contains an interface to the CA buffer, so that it is able to transfer data to/from DRAM via the private bus during the writeback, restore, and dump processes.

In an alternative embodiment, the control logic for managing the additional DRAM and NAND memory may be incorporated in the CA buffer.

Returning to FIG. 13, a write transaction from the host stores a 128B Dblock into the 16 GB DRAM M, as indicated by the two left-most arrows showing the 128B Dblock write data and the ~32b write address (which specifies where in M to write the Dblock).

The write transaction also causes the persistence buffer B to write an 8b Dtag into the 128 MB DRAM K with the same write address as used by M (preferably with identical timing constraints if the extra DRAM memory has the same bank and rank organization as the M memory devices). This step is indicated with the red arrow that is third from the left.

The stored 8b Dtag indicates whether the corresponding Dblock in M is clean or dirty; this indicates whether the corresponding Dblock in the 16 GB DRAM M and 16 GB NAND P match or don't match. Typically, one of the 256 values indicates clean, and the other 255 values indicate dirty.

In the case that the Dblock is dirty, the Dtag indicates when the Dblock in the DRAM was last written.

A TimeStamp circuit creates an absolute time value, and the low-order bits are used as a relative time-stamp for the Dtag entry.

When the relative time-stamp is read, it will be corrected if the absolute timestamp has wrapped around the maximum value.

The logic must also ensure that the stored Dtag relative timestamps clamp at a limit value when the absolute timestamp increments ~254 times. Typically, one of the 255 dirty values will indicate this.

Typically each Dtag will be read many times before there is the possibility of overflow (with respect to the current time value). The timestamp field can be clamped to the limit dirty value at one of these times.

Writeback Operations

Dirty Dblocks in 16 GB DRAM are eventually written back to the 16 GB NAND when they become old enough or meet some other defined criteria. This will potentially interfere with normal host read and write transactions. There are at least two ways to manage this:

[1] increase the refresh issuance rate at the host but not at DRAM M, and use the extra ~150 ns ARF refresh intervals to hide reads the DRAM M (~192B burst per interval) onto the private DQ bus instead of refreshing;

[2] use a control signal from module to controller to indicate that a read or write transaction must be held off and retried later, to allow time for one or more private bus writeback transactions.

The DRAM read bandwidth needed to service writeback transactions can be small—typically 0.1% to 3.0% of the peak primary bus bandwidth. The average read bandwidth needed to support writeback is ultimately limited by the write endurance of the 16 GB NAND and the desired lifetime of the module.

For example, if the NAND components have an endurance of $10^5$ write cycles, a 16 GB capacity, and a 5 year lifetime is desired, the average writeback bandwidth should be no larger than about 10 MB/s.

The writeback granularity is in units of Eblocks (128 KB). A queue to be written back is created by selecting the Eblock with, e.g., the oldest and most numerous dirty Dblocks.

The DRAM read process for the next writeback Eblock in the queue is indicated by the two arrows on the left of FIG. 4. The NAND write process for the next Eblock in the queue is indicated by the two arrows on the right of FIG. 14.

After an Eblock is written back, the 1024 Dtag entries are all cleared, indicating they are clean (the 16 GB DRAM M and 16 GB NAND P match for this Eblock).

Figure 14:
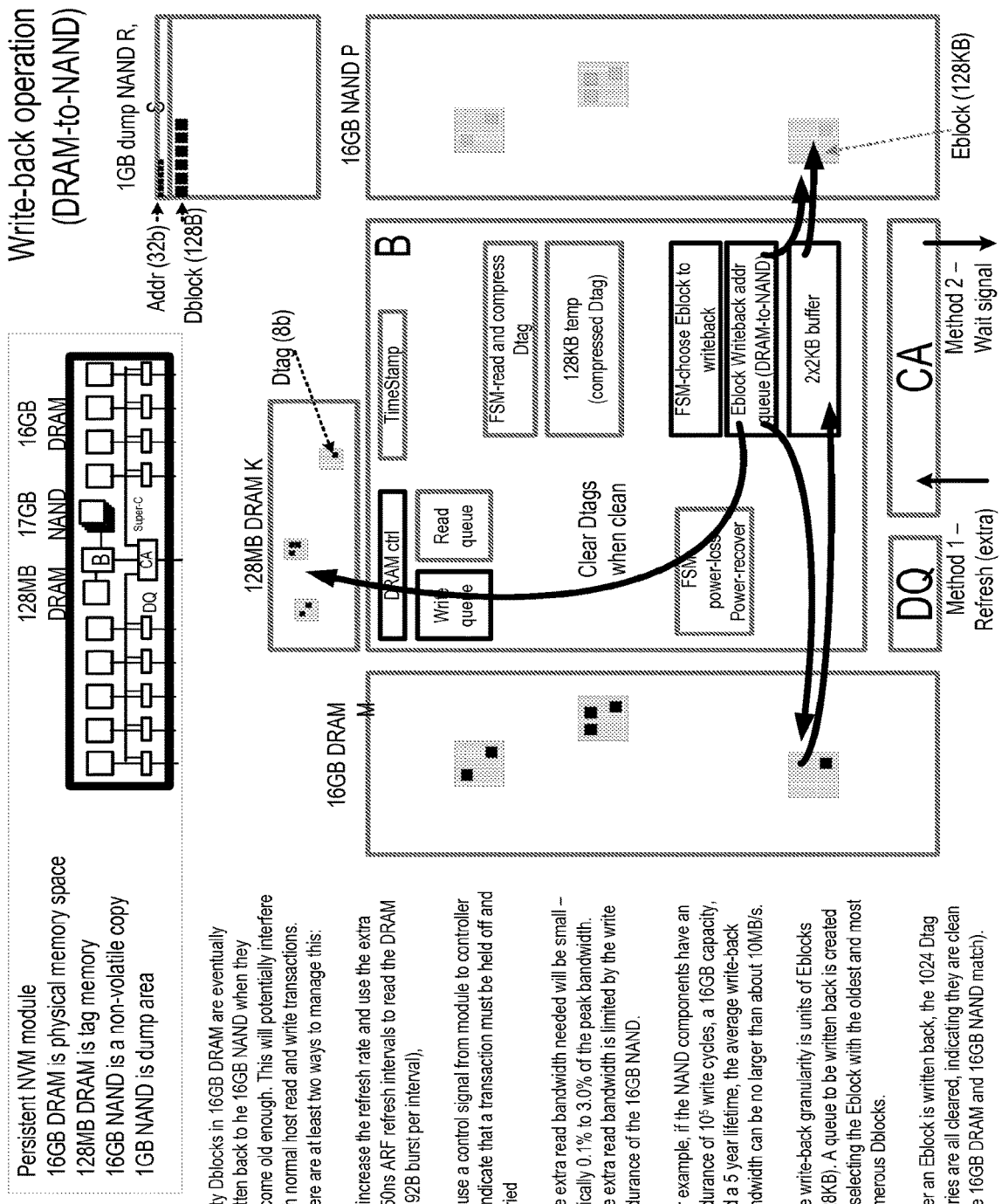
FIG. 14 illustrates, for the configuration of FIG. 12, module activities for a writeback of updated data in the DRAM to the image stored in NAND.

This Dtag write process in the 128 MB DRAM memory K is indicated by the center arrow of FIG. 14.

Read Dtag

Figure 15:
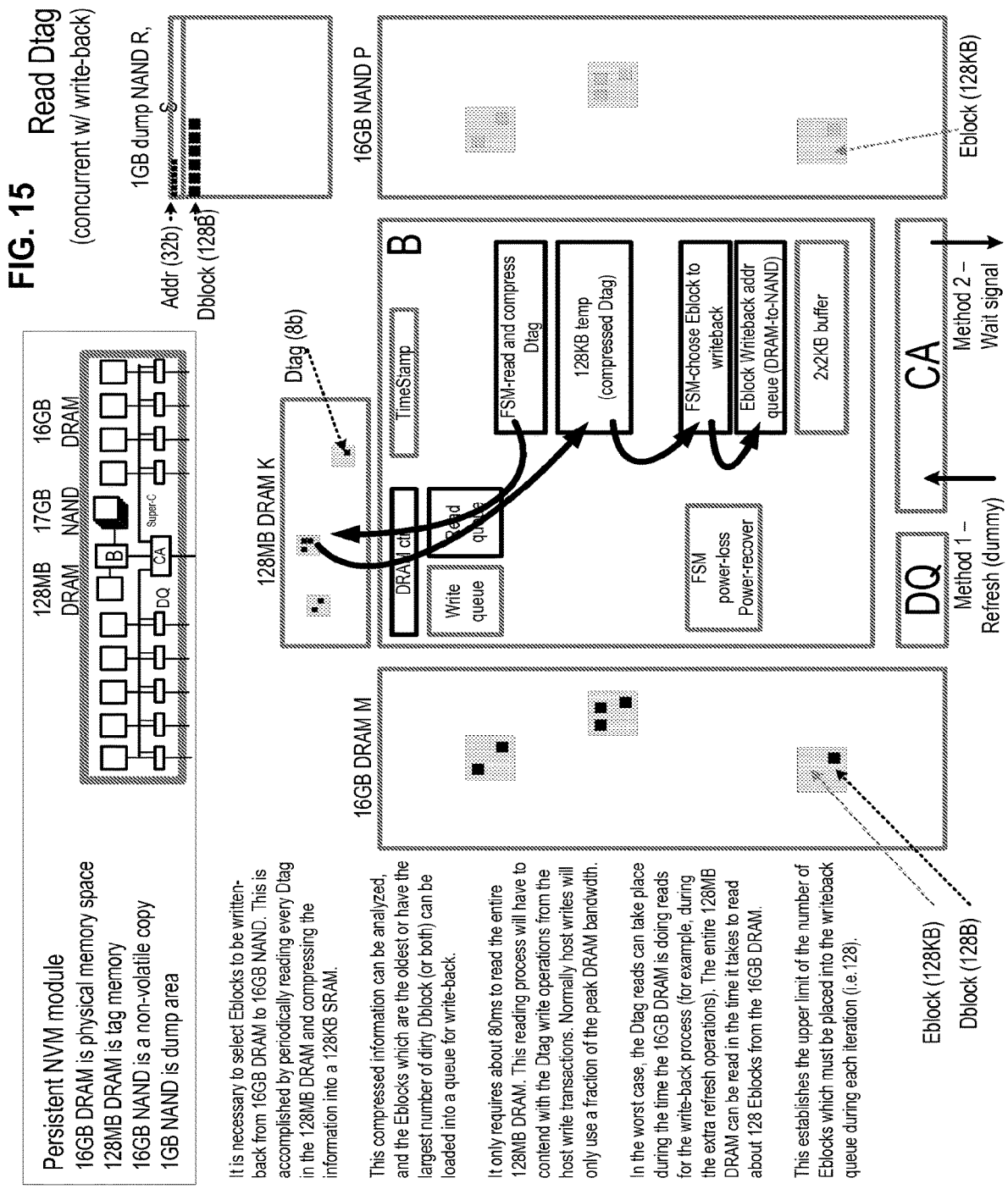
FIG. 15 illustrates, for the configuration of FIG. 12, a scanning process to select which Eblocks to be written-back from 16 GB DRAM to 16 GB NAND.

It is necessary, assuming significant write traffic to a significant number of different addresses in DRAM M is ongoing, for buffer B to continually select Eblocks to be written-back from 16 GB DRAM M to 16 GB NAND P. This is accomplished by the buffer B periodically reading every Dtag in the 128 MB DRAM K and compressing the information into a 128 KB SRAM, one entry per Eblock (the compressed value can be, for instance, some combined score that represents the number of dirty Dblocks and their average age). This is indicated by the top two arrows in FIG. 15.

This compressed information can be analyzed, and the Eblocks which are the oldest or have the largest number of dirty Dblocks (or some combination of both metrics) can be loaded into a queue for writeback. This is indicated by the two arrows in the center of FIG. 15.

It only requires about 80 ms to read the entire 128 MB DRAM K. This reading process will have to contend with the Dtag write operations paired with the host write transactions. Normally host writes will only use a fraction of the peak DRAM bandwidth.

In the worst case, the Dtag reads can take place during the time the 16 GB DRAM M is doing reads for the writeback process (for example, during the extra refresh time slots). The entire 128 MB DRAM K can be read in the time it takes to read about 128 Eblocks from the 16 GB DRAM M.

This ratio establishes an upper limit of the number of Eblocks which can be placed into the writeback queue during each iteration (i.e. 128 in this example) through memory K.

Power Loss

When power is lost or a full snapshot is requested by the host, it is only necessary to save the dirty Dblocks in the 16 GB DRAM M.

Figure 16:
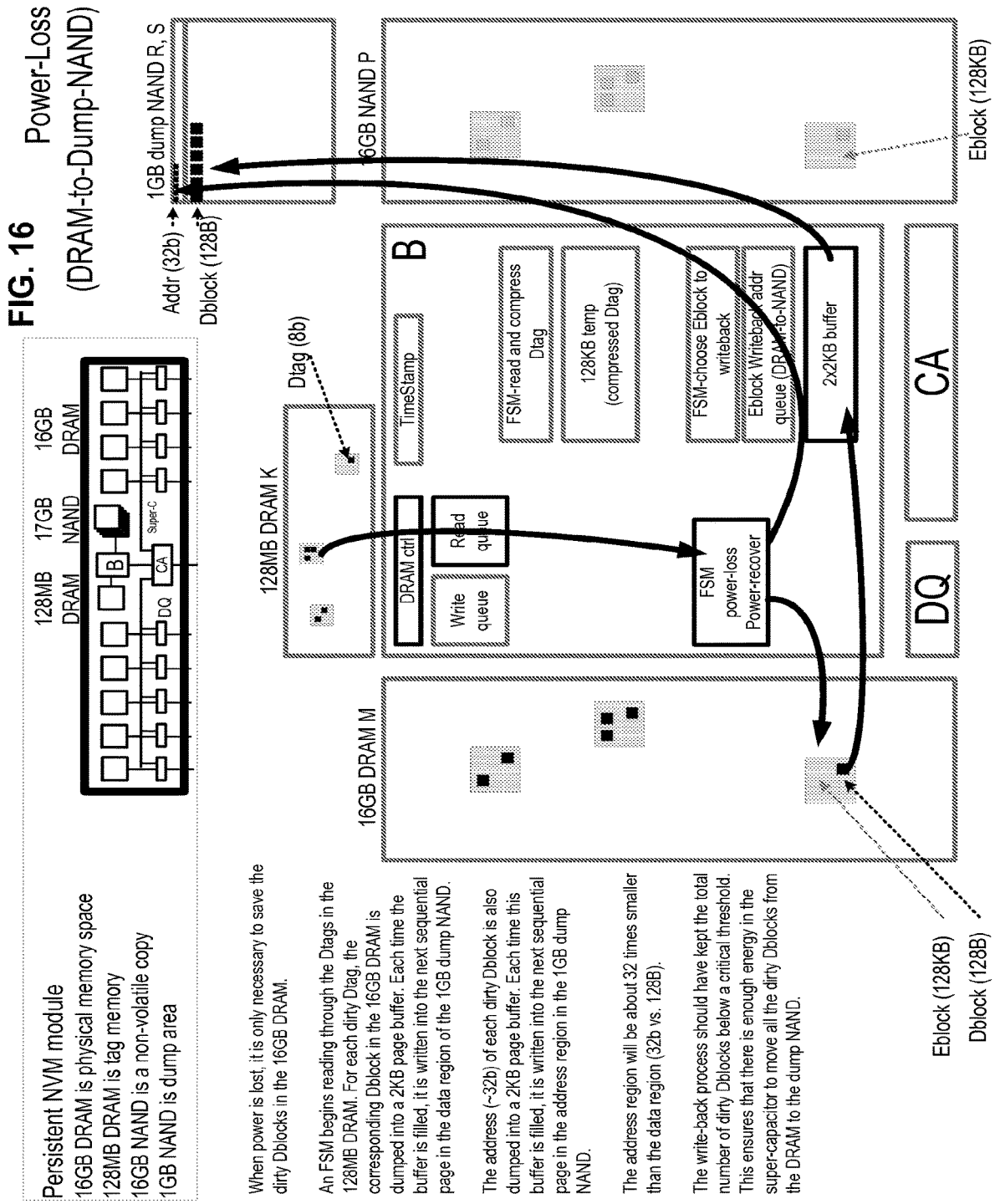

An FSM (finite-state-machine; control logic used for implementing a sequencing process) begins reading through the Dtags in the 128 MB DRAM K. This is indicated by the upper-center arrow in FIG. 16.

For each dirty Dtag, the corresponding Dblock in the 16 GB DRAM M is dumped into a 2 KB page buffer on buffer chip B. Each time the page buffer is filled, it is written into the next sequential page in the data region of the 1 GB dump NAND S. This is indicated by the left pair of arrows connecting to the left FSM block in FIG. 16. The arrows indicate the direction of an address and the data being read.

The address (~32b) of each dirty Dblock is also dumped into another 2 KB page buffer on buffer chip B. Each time this page buffer is filled, it is written into the next sequential page in the address region R in the 1 GB dump NAND. This is indicated by the right pair of arrows connecting to the 2×2K buffer block in FIG. 16. The arrows indicate the direction of an address and the data being written.

The address region R of the 1 GB dump NAND will be about 32 times smaller than the data region S (the entry size is 32b vs. 128B).

The writeback process should have kept the total number of dirty Dblocks below a critical threshold. This ensures that there is enough energy in the super-capacitor to move all the dirty Dblocks from the DRAM to the dump NAND. Note that due to the dump process not replacing Eblocks in NAND P but only saving dirty Dblocks, more dirty Dblocks can be handled than if the dump process simply used the writeback process.

Power Recovery—A

After a power loss event, and once power has been restored to the system, it is necessary to merge the dirty Dblocks in the 1 GB dump NAND S with the 16 GB NAND P and rewrite to the 16 GB DRAM M and 16 GB NAND P.

Figure 17:
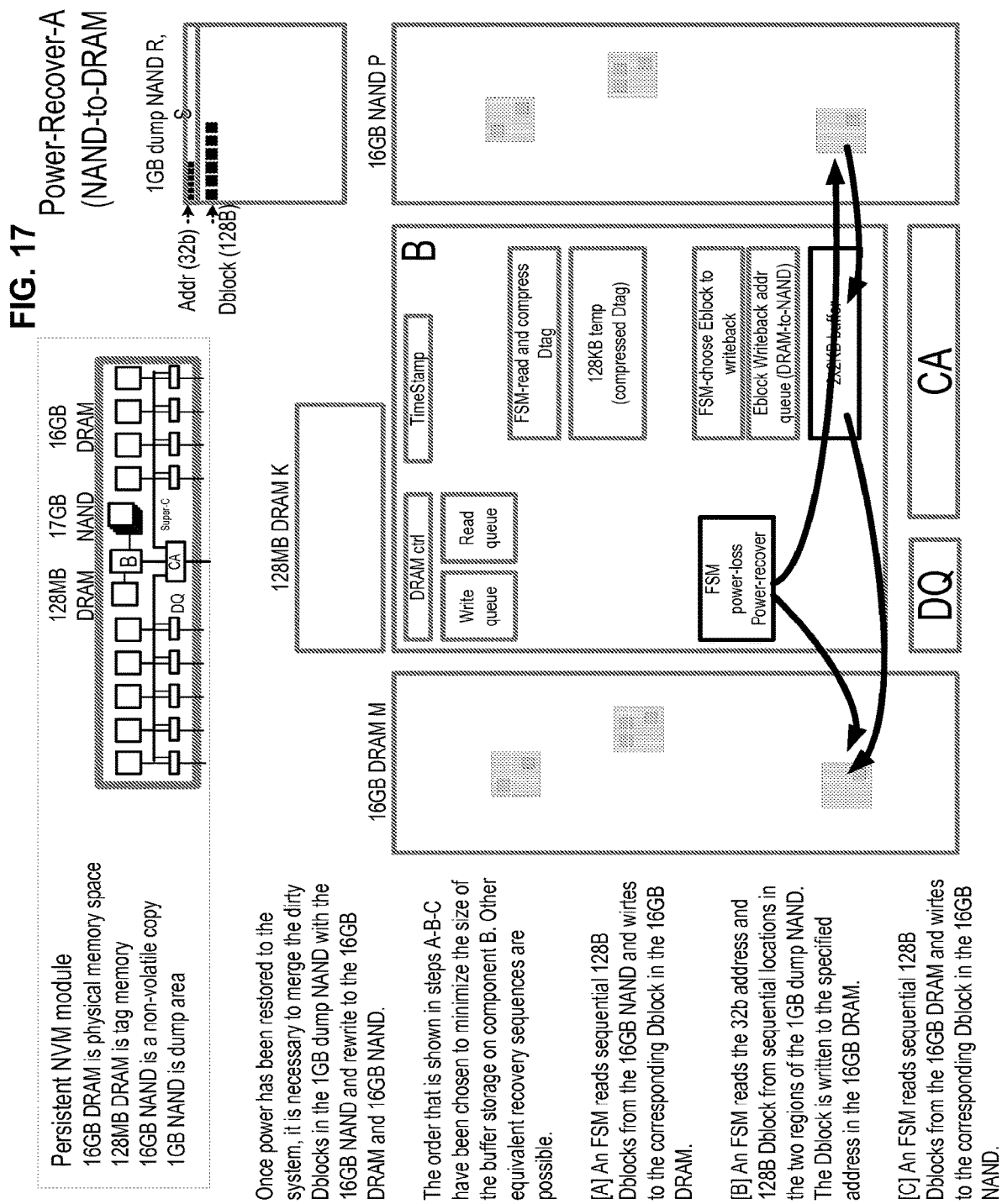
FIGS. 17, 18, and 19 show, for the configuration of FIG. 12, three steps in a system restore process that runs on the module during power recovery.
Figure 18:
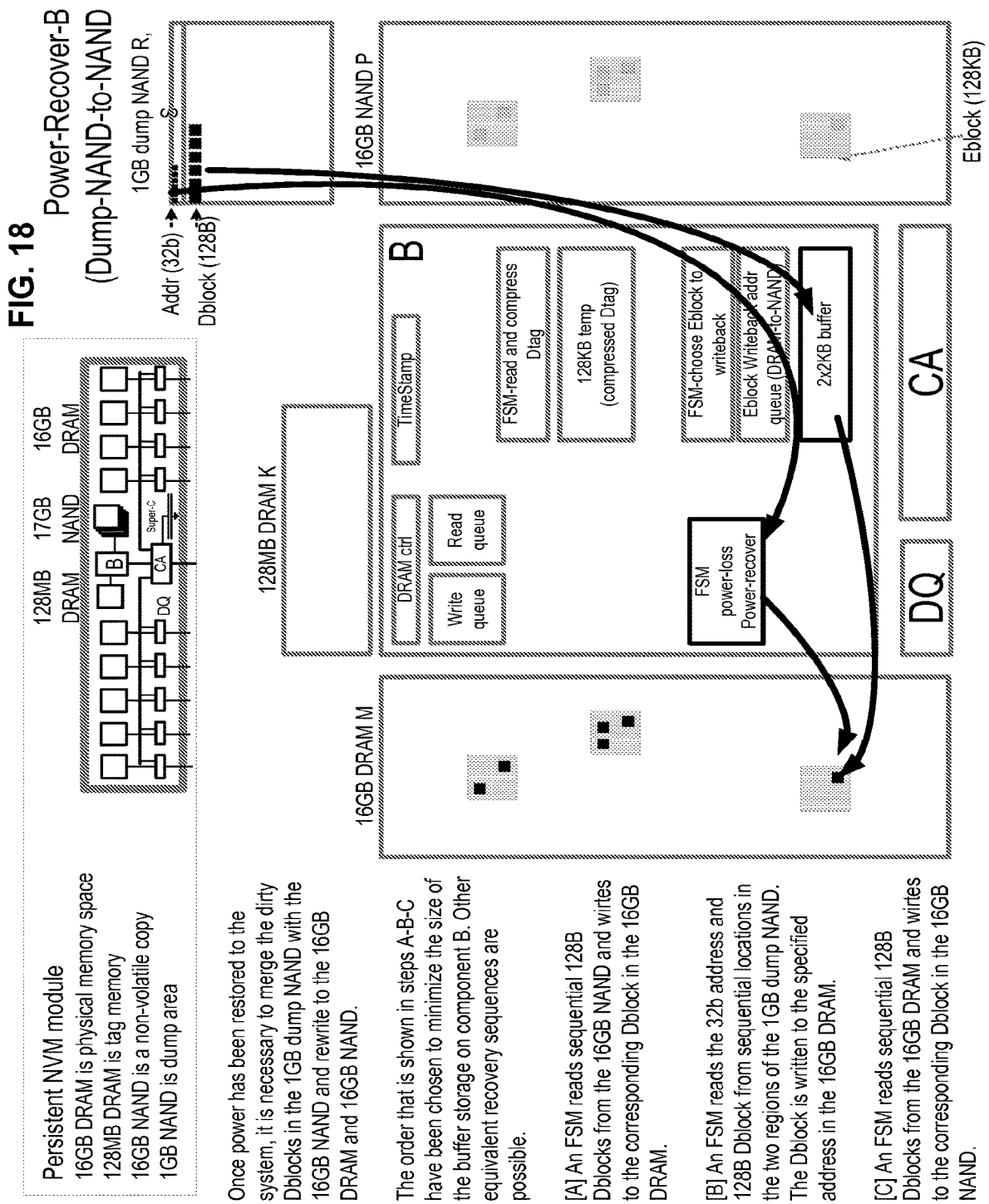
Figure 19:
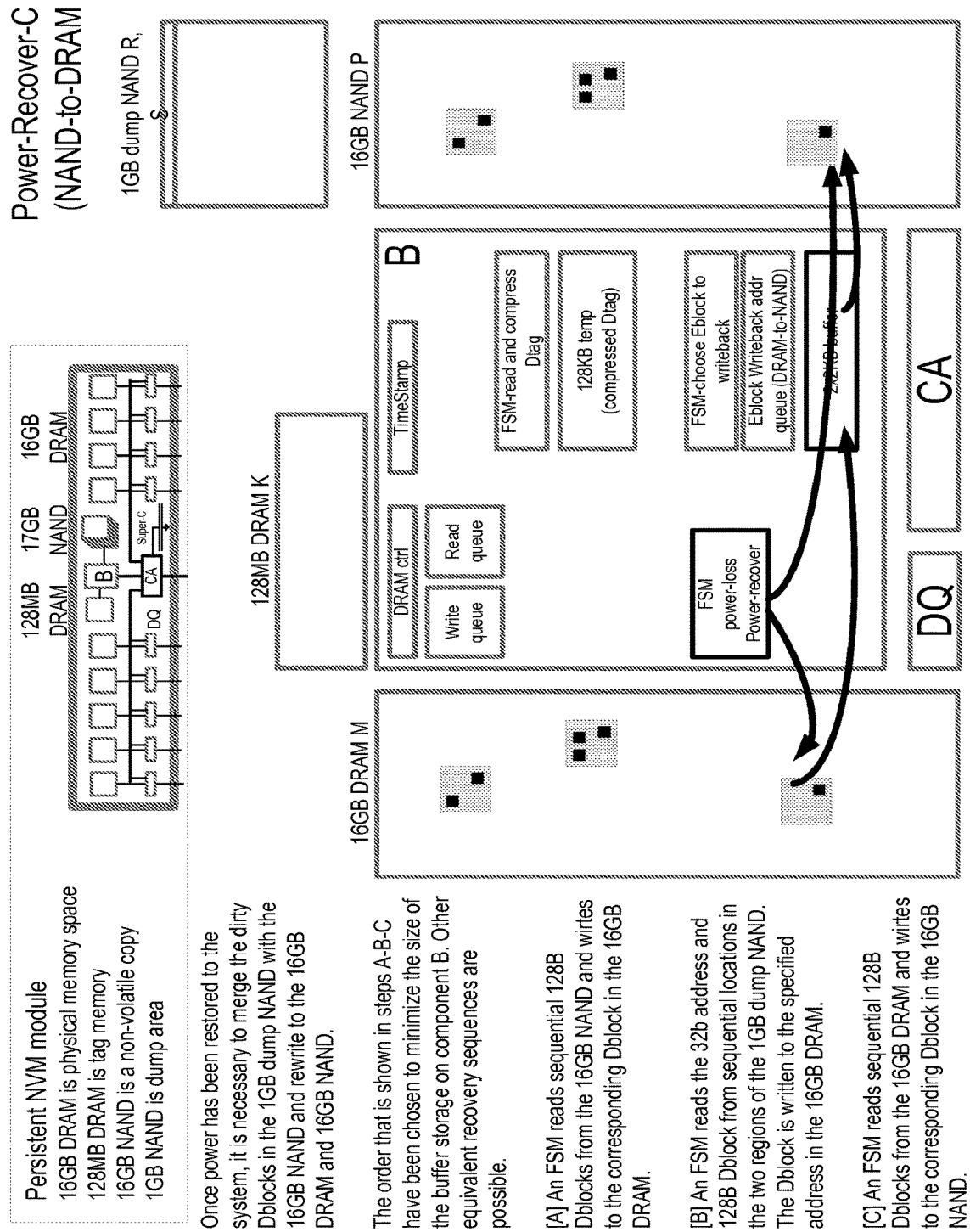

The order that is shown in steps A-B-C of FIGS. 17-19, respectively, has been chosen to minimize the size of the buffer storage on component B. Other equivalent recovery sequences are possible.

[A—FIG. 17] An FSM reads sequential 128B Dblocks from the 16 GB NAND P and writes each to the corresponding Dblock in the 16 GB DRAM M.

Power Recovery—B

[B—FIG. 18] An FSM reads the 32b address and 128B Dblock from sequential locations in the two regions R and S of the 1 GB dump NAND. The retrieved Dblock is written to the retrieved address in the 16 GB DRAM M.

Note that stale Dblocks from the 16 GB NAND P, although earlier written to M, will be overwritten in M with the newer, correct Dblock from the 1 GB dump NAND. In an alternate arrangement with an extra page buffer available, processes A and B can proceed together, e.g., stale Dblocks from NAND P are replaced from page-buffered new copies from S, as NAND P is copied over to DRAM M. This is straightforward if the dump NAND was populated in the same address sequence as the restore process uses.

Power Recovery—C

[C—FIG. 19] Note that once all the Dblocks have been correctly merged in the 16 GB DRAM M, the contents of the 16 GB DRAM are copied to the 16 GB NAND P to create the most up-to-date starting point. An FSM reads sequential 128B Dblocks from the 16 GB DRAM M and writes to the corresponding Dblock in the 16 GB NAND P. In a slightly more complex process C, the addresses from dump NAND region R are read again, and only the corresponding Eblocks in 16 GB NAND P are read, erased, and replaced from DRAM M.

Rotational Wear Leveling

The first detailed embodiment has the characteristic that the 16 GB DRAM address space M is mapped in one contiguous block onto the 16 GB NAND space P.

This has the advantage of simple address translation between the two 16 GB spaces, but can result in a wear imbalance in the NAND components—this means that some erase blocks will be over-written more frequently than others, limiting the lifetime of the component to that of the more-frequently-written erase blocks.

Figure 20:
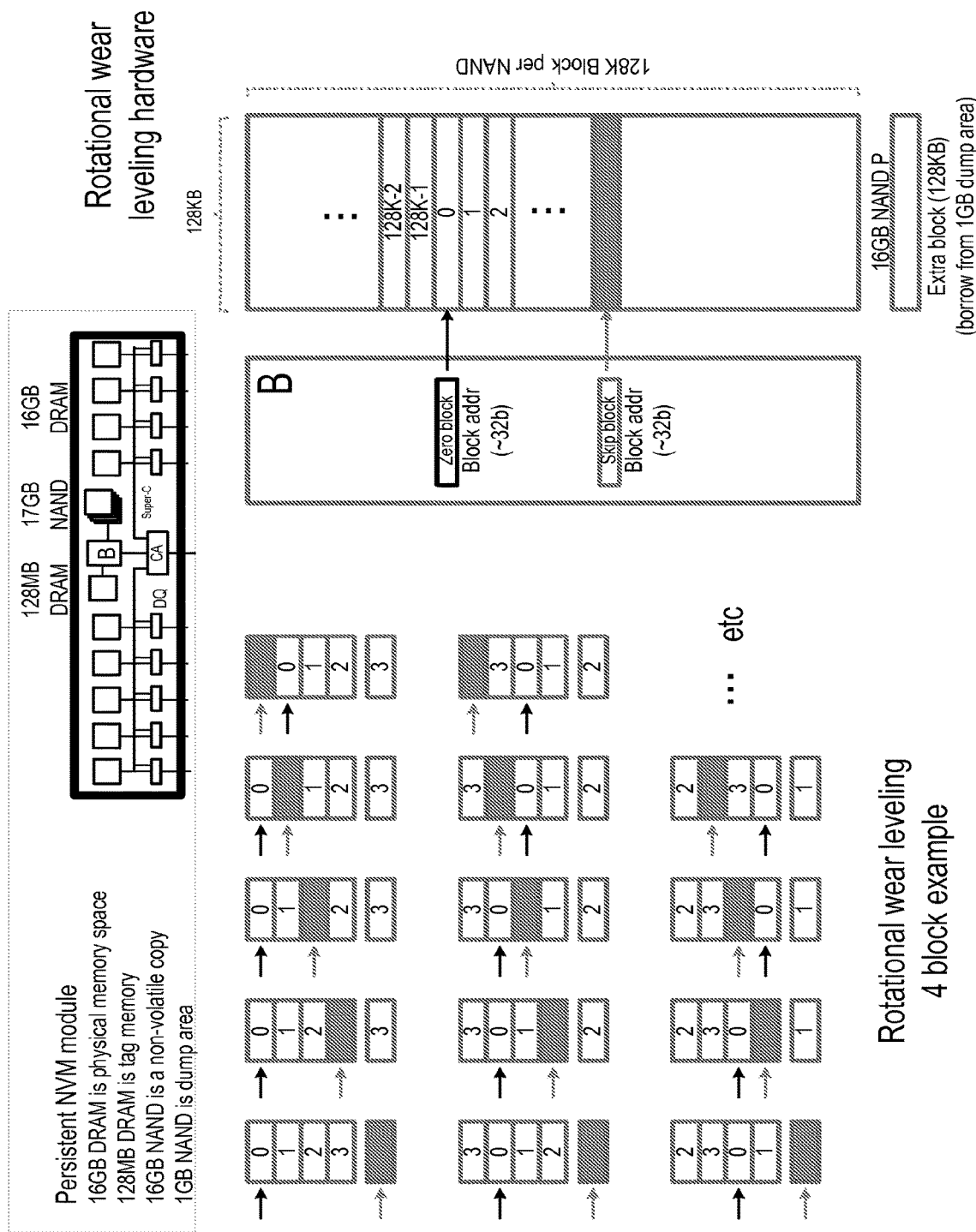
FIG. 20 shows a wear-leveling method that allows the write activity to be spread evenly across each NAND component in, e.g., an embodiment such as that of FIG. 12.

FIG. 20 shows a method that allows the write activity to be spread evenly across each NAND erase block. In one embodiment, the method uses an offset pointer, which indicates where the Eblock for DRAM M address zero is located in the NAND address space P. This location will be systematically rotated through the entire NAND address space P.

There is also a spare Eblock location, shown at the bottom of FIG. 10. This is used to temporarily hold an Eblock to enable the rotation of the addresses.

There is also a second pointer which indicates which Eblock is to be skipped (because it is held in the spare block). In other embodiments, the entire dump NAND space is also included in the wear-leveling rotation.

The mapping of the 128K Eblocks from DRAM to NAND consists of an offset value (the zero pointer), with all addresses held in contiguous locations relative to address zero (and wrapping from the maximum value to the minimum value). The addressing logic will also swap in the extra block for the skip location using a 17b address comparator and a multiplexer.

The left diagram in FIG. 20 shows the sequencing for a simple four Eblock example. In the upper left, block 0 of the DRAM maps to the first Eblock of the NAND, and the skip block is the extra Eblock at the bottom of the four NAND blocks.

The skip block is then sequentially rotated though each of the four block positions. Each step involves copying the target block to the empty block and changing the skip pointer.

This sequencing continues through the lifetime of the system. Eventually, every block of the DRAM will be mapped to every block of the NAND for a fixed interval of time.

Note that the second detailed embodiment will use a more sophisticated mapping method that can avoid wear leveling issues.

Improved NAND Organization—2nd Detailed Embodiment

A first detailed embodiment has been described in the previous sections of this application. This second detailed embodiment provided fine-grain tracking of the dirty Dblocks (128B in the example) so that the amount of information that is dumped at power loss is minimized, all NAND blocks wear equally, and overall write bandwidth to NAND is kept low, extending the performance and/or usable life of the NVDIMM.

The first detailed embodiment has the disadvantage (from a performance/lifetime perspective) of having a simple mapping between Eblocks (128 KB in the example) in the DRAM and NAND. This means that the writeback process is coarse-grained (1024× the granularity of the dump process). Consequently, each writeback of a Eblock typically will include both dirty and clean Dblocks.

A second detailed embodiment is described in the next sections. It provides a more flexible mapping between Dblocks in the DRAM and NAND, allowing the writeback process to have the same Dblock granularity as the dump process. This generally will optimize the available write bandwidth and write endurance of the NAND memory. This embodiment has the secondary benefit of not needing a rotational wear leveling mechanism, as described in FIG. 20.

Figure 21:
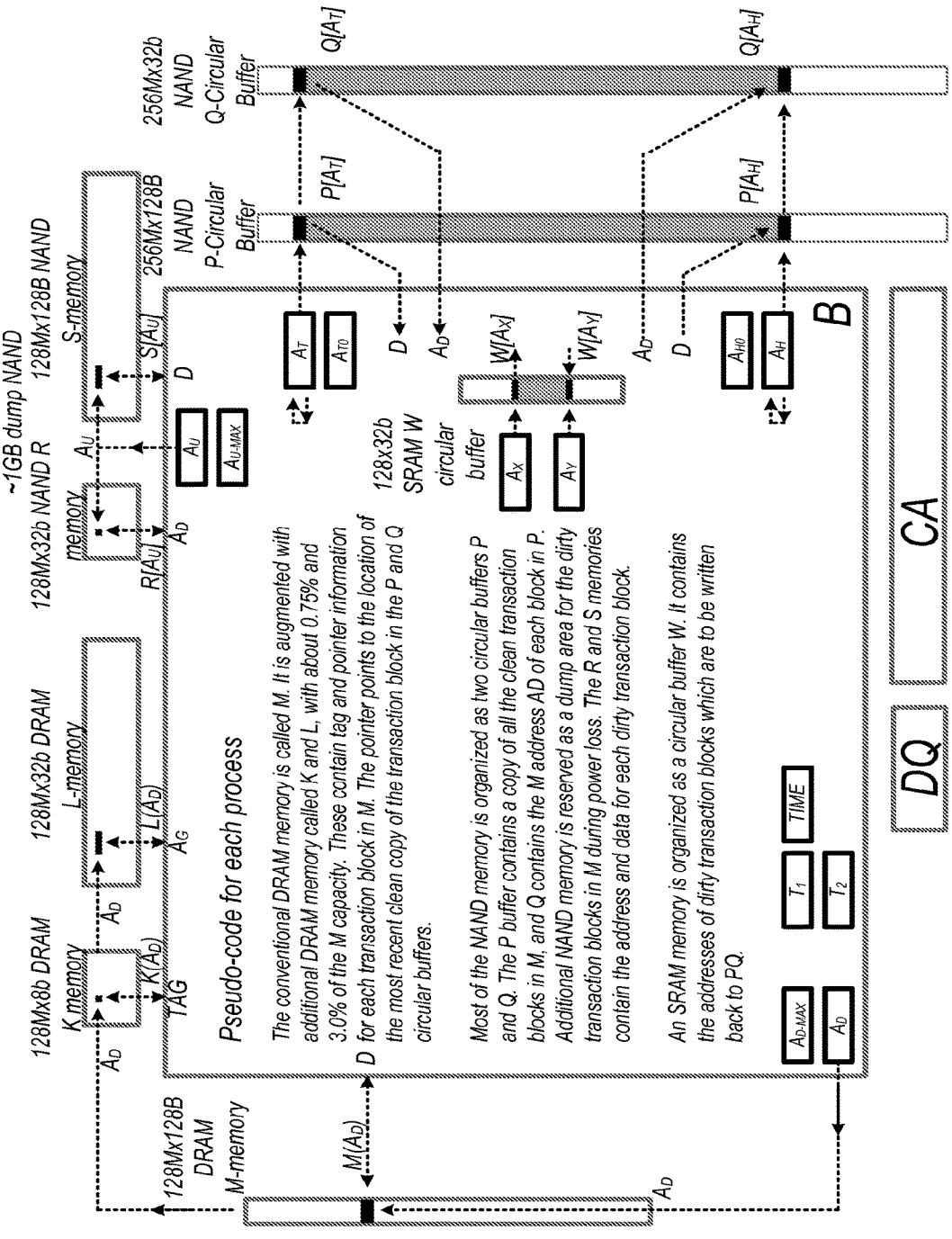
FIG. 21 shows another incremental-state-capture embodiment that uses DRAM and NAND FLASH, but in a different configuration from FIG. 11.

FIG. 21 shows the NVDIMM elements for this embodiment. The elements include the M and K DRAMs, the R and S dump NANDs, and the P copy NAND from the first embodiment. To these elements, FIG. 21 adds an L DRAM memory space and a Q NAND memory space.

The conventional 16 GB DRAM memory is M. It is augmented with additional 128 MB and 512 MB DRAM memories K and L (these represent about 0.75% and 3.0% of the M capacity, respectively). K and L respectively contain tag and pointer information for each transaction block (128B Dblock) in M.

The tag in K indicates dirty or clean status (plus a timestamp) of the Dblock, as in the first embodiment. The pointer in L points to the location of the most recent (clean) copy of the transaction Dblock in the P and Q circular NAND buffers. If the Dblock is dirty, this pointer is by definition invalid.

Most of the 32 GB NAND memory is organized as two circular buffers P and Q. Its size has been doubled (relative to embodiment one) because space is required for the consolidation process. Other sizes are possible, but the example used here assumes 32 GB.

The P buffer contains a copy of all the clean transaction blocks (128B Dblocks) in M, plus during times of system writes to M, stale blocks, and the respective locations in the Q buffer contain the M address AD (approximately 32b) of each Dblock in P. Thus depending on how often a particular Dblock is saved, Q may contain several duplicates of the same address, with only the one nearest the head pointer corresponding to valid data.

Additional NAND memory is reserved as a dump area for the dirty transaction blocks in M after power loss (or during a commanded snapshot). The R and S memories contain the address and data for each dirty transaction block. This memory will typically be carved out of the same NAND space used for P and Q (because P and Q have the same organization as R and S, some embodiments can coalesce R to the head of Q and S to the head of P). The number of entries available will be large enough to accommodate the total number of dirty Dblocks in the M DRAM memory at any point in time (this is similar to embodiment one).

An SRAM memory in the B component is organized as a circular buffer W. It contains a queue of addresses of dirty transaction blocks which are to be written back to PQ.

There are dedicated control registers used to access the different memory spaces. They will be described in detail in later sections.

Access granularity of the NAND memory components is carefully matched to that of DRAM M in this embodiment.

A random read operation to NAND has a granularity of one page (2 KB is assumed in this example).

A random write operation (also called a "program" operation) to NAND also has a granularity of one page (2 KB is assumed in this example).

A write operation to a NAND page must, however, be preceded by an erase operation with a granularity of one erase block (128 KB is assumed in this example). But with a single erase, all 64 NAND pages in the erase block can then be written sequentially.

This is why the random writeback process of detailed embodiment one has a granularity of an erase block (128 KB Eblock).

Detailed embodiment two avoids this constraint by accessing the P and Q memory spaces sequentially, not randomly.

This means that buffer B will need to assemble a group of 16 Dblocks (each 128B) in a 2 KB page buffer before performing a sequential write to P memory.

Likewise, this means that buffer B will need to assemble a group of 512 Dblock addresses (each 32b) in a 2 KB page buffer before performing a sequential write to Q memory. Sequential writes have already been used in embodiment one, for dumping the dirty Dblocks (and addresses) from DRAM to the dump NAND. They will continue to be used in embodiment two, for dumping the dirty Dblocks (and addresses) from DRAM to the dump NAND into the R and S memory space.

Sequencing Example [1]

Figure 22:
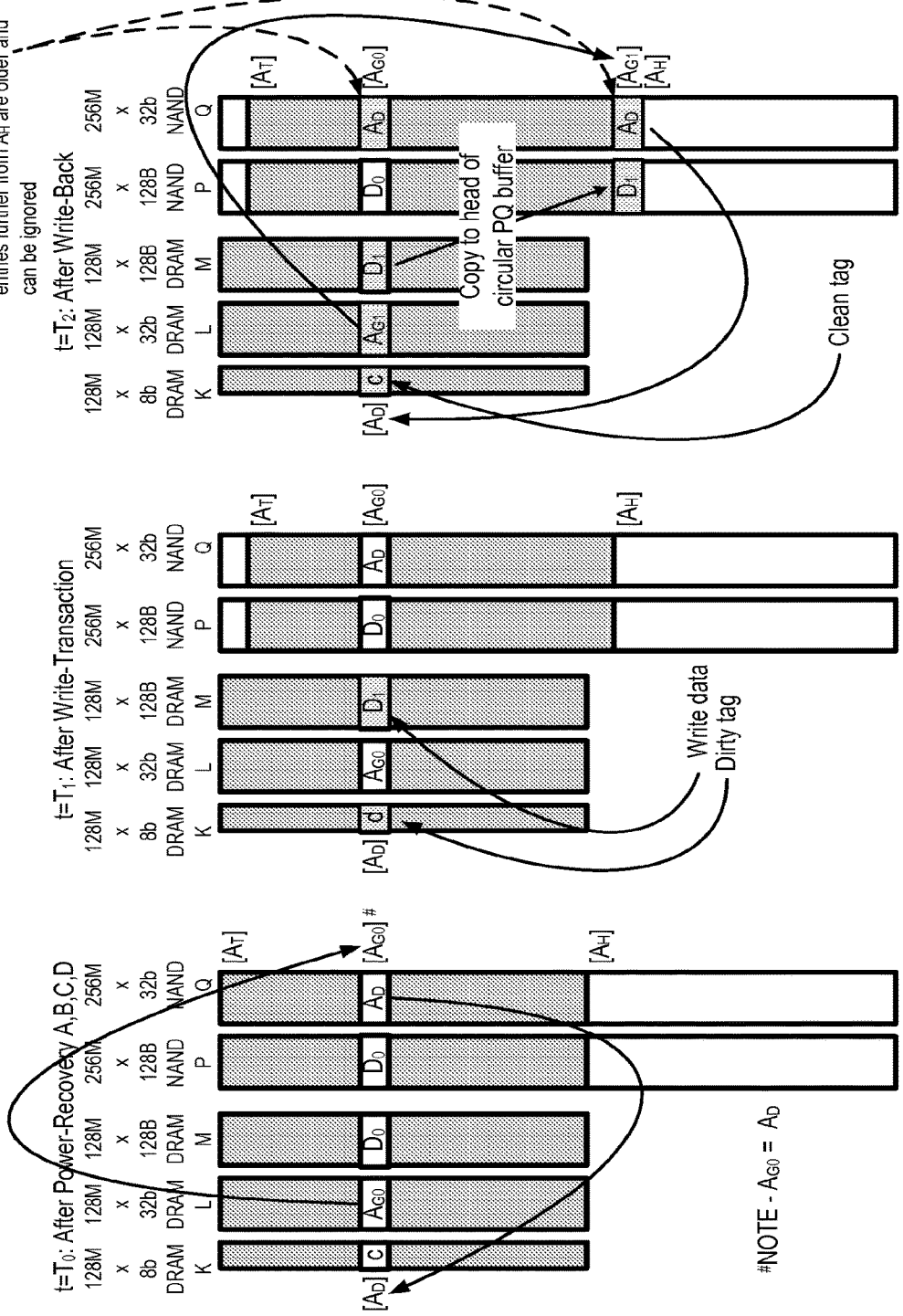
FIGS. 22-25 show five of the memory spaces (K, L, M, P, and Q) on the module of FIG. 21 during several organizing activities that take place during module usage in a normal mode.

Before the NVDIMM elements of embodiment two are discussed in detail, an overview will be provided using sequencing examples. FIG. 22 shows five of the memory spaces (K, L, M, P, and Q) from the FIG. 21 NVDIMM. The activity of a single Dblock will be shown during several process steps.

In the left diagram, after a power recovery (or after system initialization) a Dblock D0 is loaded at address AD in both the M memory and the P memory. The corresponding tag is clean ("c") at address AD in K memory. The corresponding pointer is AG0 at address AD in L memory.

At this time, AG0 is equal to AD, and points to the address in the P memory where a copy of D0 resides. AG0 also points to the address in the Q memory with a pointer AD to the original data in memory M.

Only half of the P and Q memories are needed to hold a copy of the M memory in this example—this is indicated by the head and tail pointers (AT and AH). The upper portion of the P and Q memories is erased, and ready to be written.

In the middle diagram of FIG. 22 a write transaction to address AD has occurred. The corresponding tag is now set to dirty ("d") at address AD in K memory. This entry will also be time stamped.

The corresponding pointer is still AG0 at address AD in L memory, but it is now invalid because the tag is dirty. Alternatively, the pointer entry could be changed to a value which indicates invalid.

Figure 23:
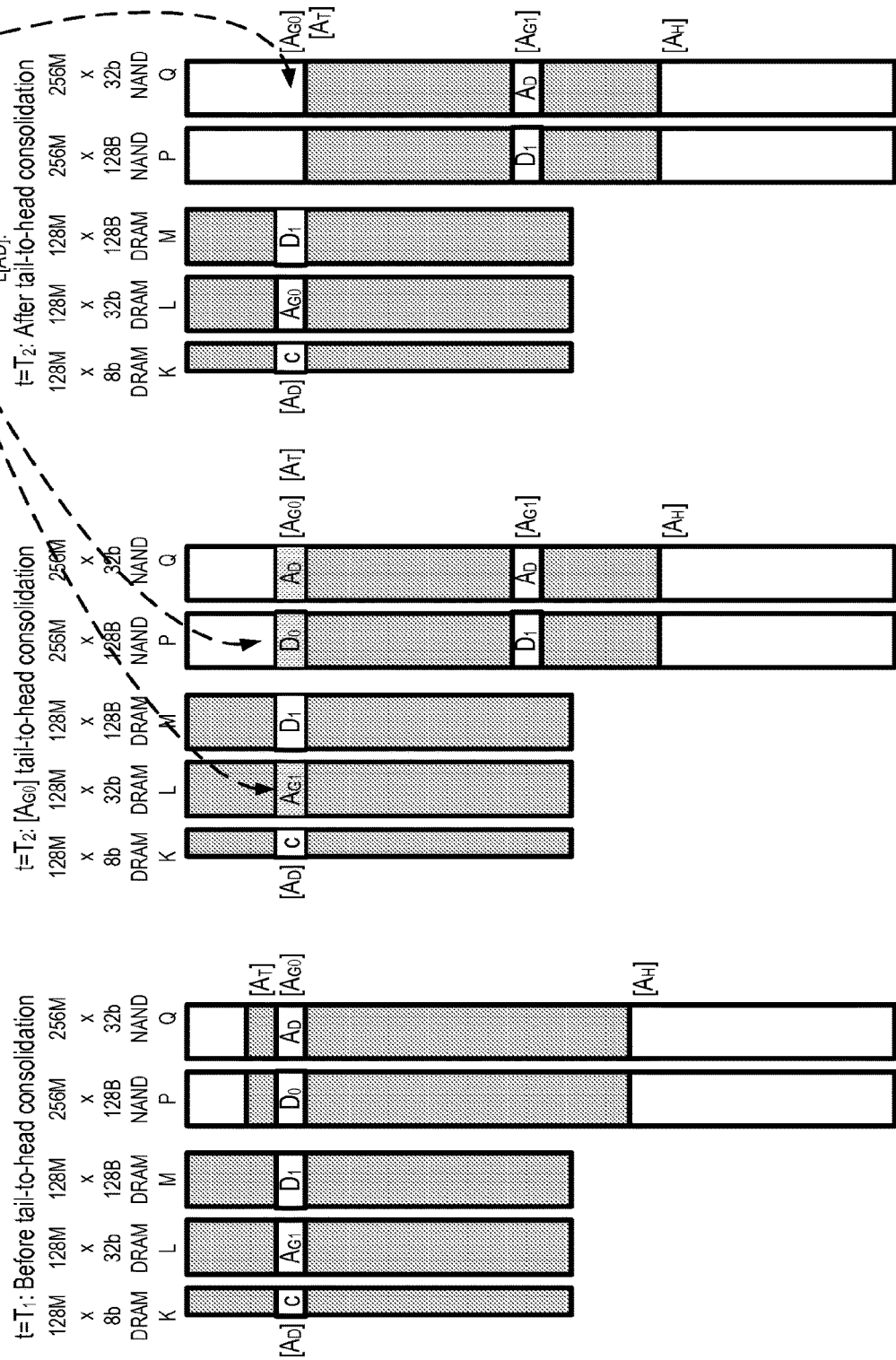

The entries at AG0 in the P and Q memories are not modified—they will eventually be removed during the consolidation process when the tail pointer AT reaches AG0 (shown in FIG. 23).

In the right diagram of FIG. 22 a writeback operation to address AD has been scheduled. This will typically happen after the K memory has been scanned.

The scan process involves looking for dirty blocks which are older than some threshold. This is determined by comparing the timestamp in the tag entry with the current time value.

This comparison process also handles the wrapping of the timestamp with respect to the time value. It also clamps the timestamp to a limit value if there is a danger of the timestamp value overflowing.

If a dirty block is marked for writeback, the AD address will be added to a queue in the W memory. At some time later, the writeback operation will take place.

The writeback operation copies the Dblock D1 to the address AG1 at the head of the circular buffer in memory P.

The address AD of D1 in the M memory is written to the address AG1 at the head of the circular buffer in memory Q.

The head pointer AH indicates the address for these two write operations, and is incremented afterward.

Note that the actual write data D1 and write address AD will be accumulated in respective 2 KB page buffers in buffer B before being written into the P and Q NAND memory regions.

The writeback operation is completed by setting the tag at address AD in memory K to a clean value ("c"), and by setting the pointer at address AD in memory L to the AG1 address.

This arrangement gives two sets of linked pointers for the data in DRAM and its clean copy in NAND.

When a power loss to the system occurs, the pointers in NAND (memory Q) will be retained, and will be used in the power recovery process. The pointers in DRAM (memory L) will be lost, but they are not needed for the power recovery process.

A final point to note—there are now two entries containing the address "AD" in the Q memory between the tail pointer and head pointer. The entry that is closest to the head pointer contains the correct (newest) value of D1; the entry that is further from the head pointer contains the incorrect (older) value of D0.

This can be detected by the consolidation process by looking up the pointer entry in the Q memory—this is "AG1", the address of the entry closest to the head pointer.

The control logic for the head and tail pointers will ensure that the address values wrap from the maximum address to the minimum address when the end of the P and Q memories is reached.

Sequencing Example [2a]

FIG. 23 shows the consolidation process. This process preferably runs continuously in the background. It reclaims the dirty Dblocks at the tail pointer of the P and Q memories. There are three cases to be considered, with each triggering a different set of actions.

The first case is shown in FIG. 23. There is an old copy of a clean Dblock at the tail pointer. The left diagram shows a slightly earlier time, before the tail pointer reaches AG0, and the middle diagram shows the time at which the tail pointer reaches AG0.

The consolidation process reads the Q memory at AG0, and gets the pointer AD. It then reads the K memory at AD and gets the tag indicating clean ("c"). It finally reads the L memory at AD and gets the pointer indicating AG1. Since this is different than the value of the tail pointer (AT=AG0), the process knows that a newer value of the Dblock is present.

The process deletes the P and Q entries at the tail pointer and increments the tail pointer to the next sequential block.

Sequencing Example [2b]

Figure 24:
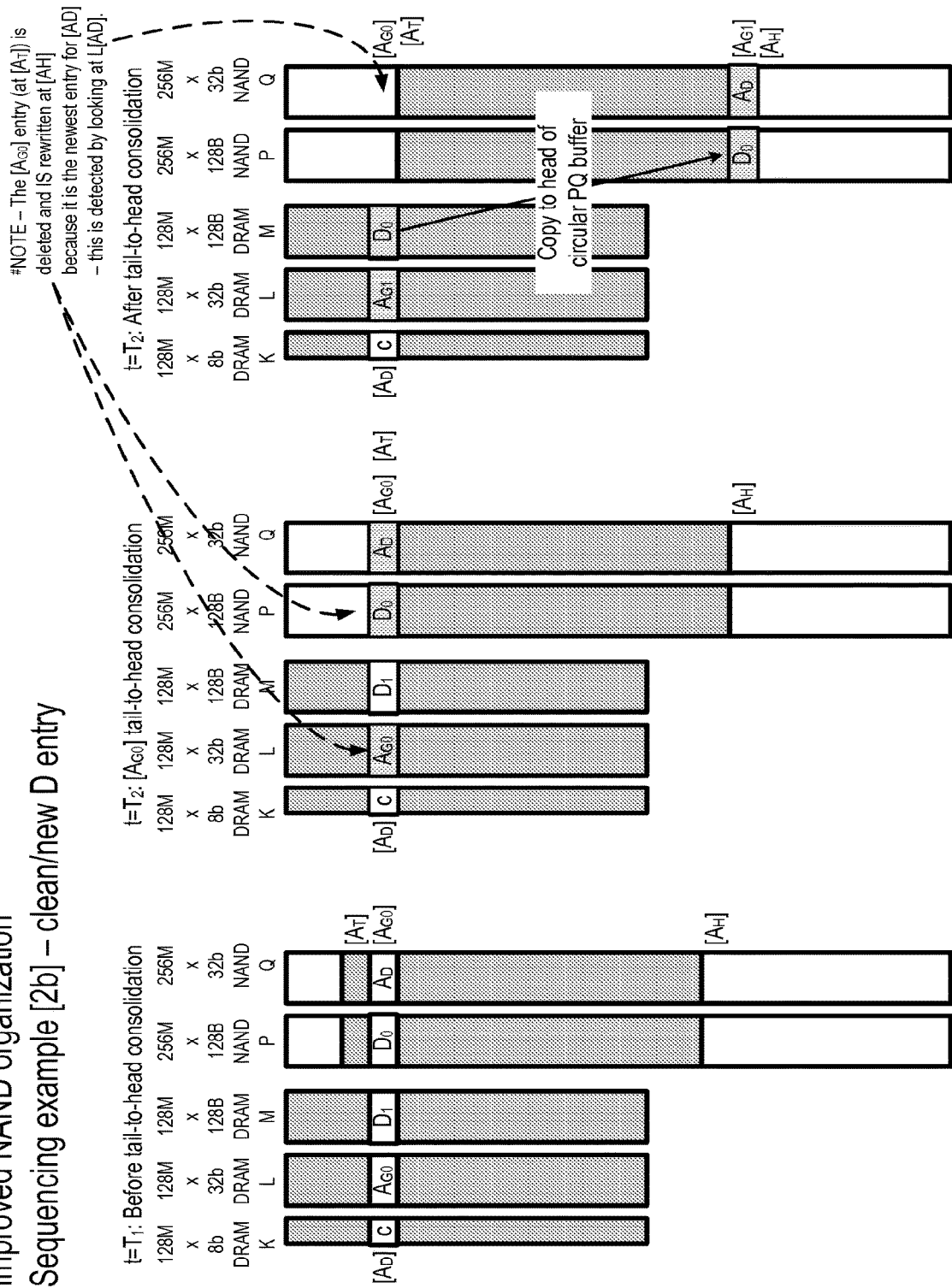

FIG. 24 shows the second case of the consolidation process. There is a new copy of a clean Dblock at the tail pointer. The left diagram shows a slightly earlier time, before the tail pointer reaches AG0, and the middle diagram shows the time at which the tail pointer reaches AG0.

The consolidation process reads the Q memory at AG0, and gets the pointer AD. It then reads the K memory at AD and gets the tag indicating clean ("c"). It finally reads the L memory at AD and gets the pointer indicating AG0. Since this is equal to the value of the tail pointer (AT=AG0), the process knows that is the newest value of the Dblock.

The process copies the Dblock D0 and the pointer AD into the P and Q entries at the head pointer (AH=AG1), updates location AD in memory L to store AG1, and increments the head pointer to the next sequential block.

The process then deletes the P and Q entries at the tail pointer and increments the tail pointer to the next sequential block.

Sequencing Example [2c]

Figure 25:
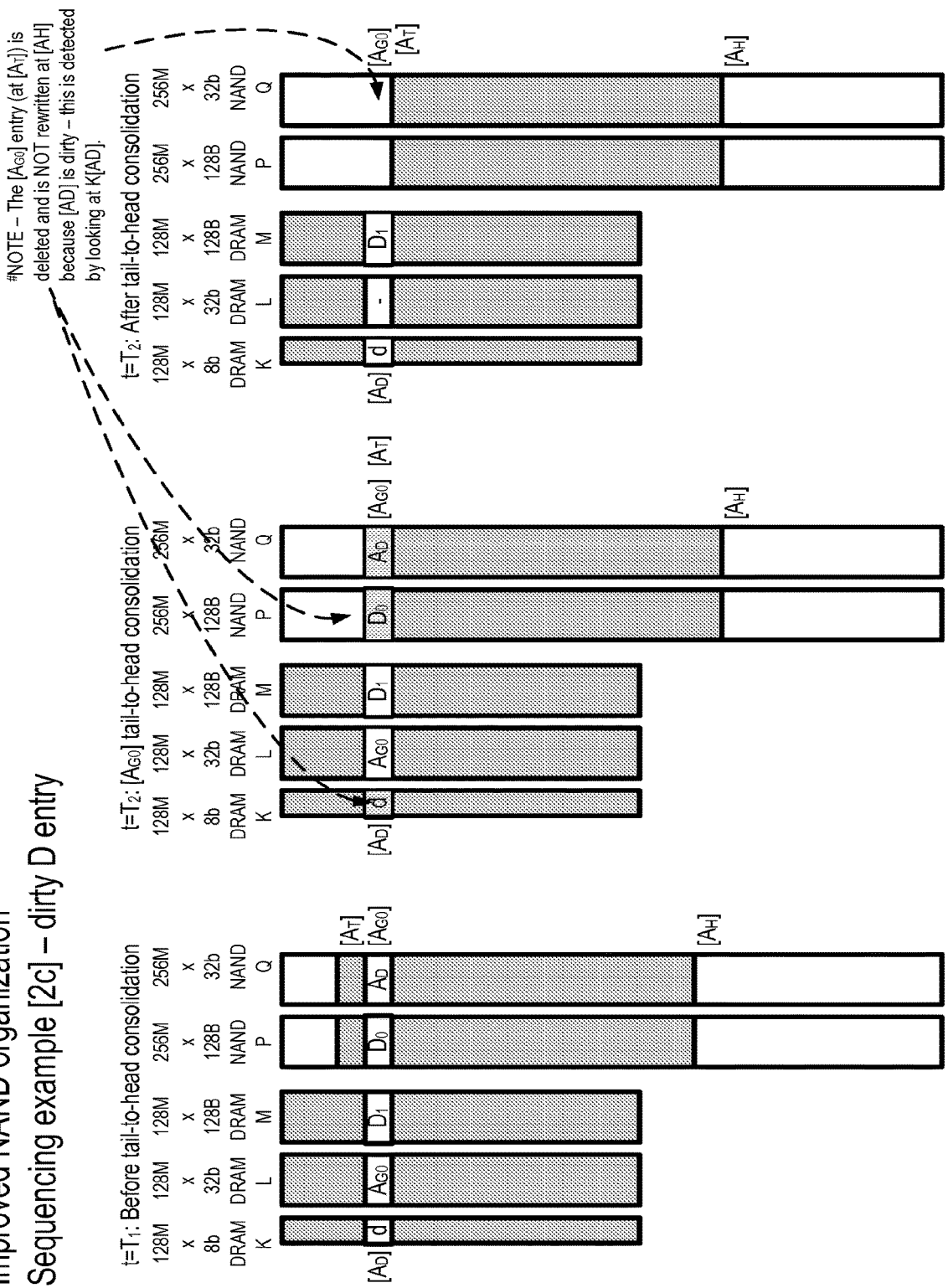

FIG. 25 shows the third case of the consolidation process. There is a copy of a dirty Dblock at the tail pointer. The left diagram shows a slightly earlier time, before the tail pointer reaches AG0, and the middle diagram shows the time at which the tail pointer reaches AG0.

The consolidation process reads the Q memory at AG0, and gets the pointer AD. It then reads the K memory at AD and gets the tag indicating dirty ("d"). It doesn't need to read the L memory at AD (which in this example contains the pointer indicating AG0) since the pointer is invalid for a dirty Dblock.

The process deletes the P and Q entries at the tail pointer and increments the tail pointer to the next sequential block.

Write Transactions

Figure 26:
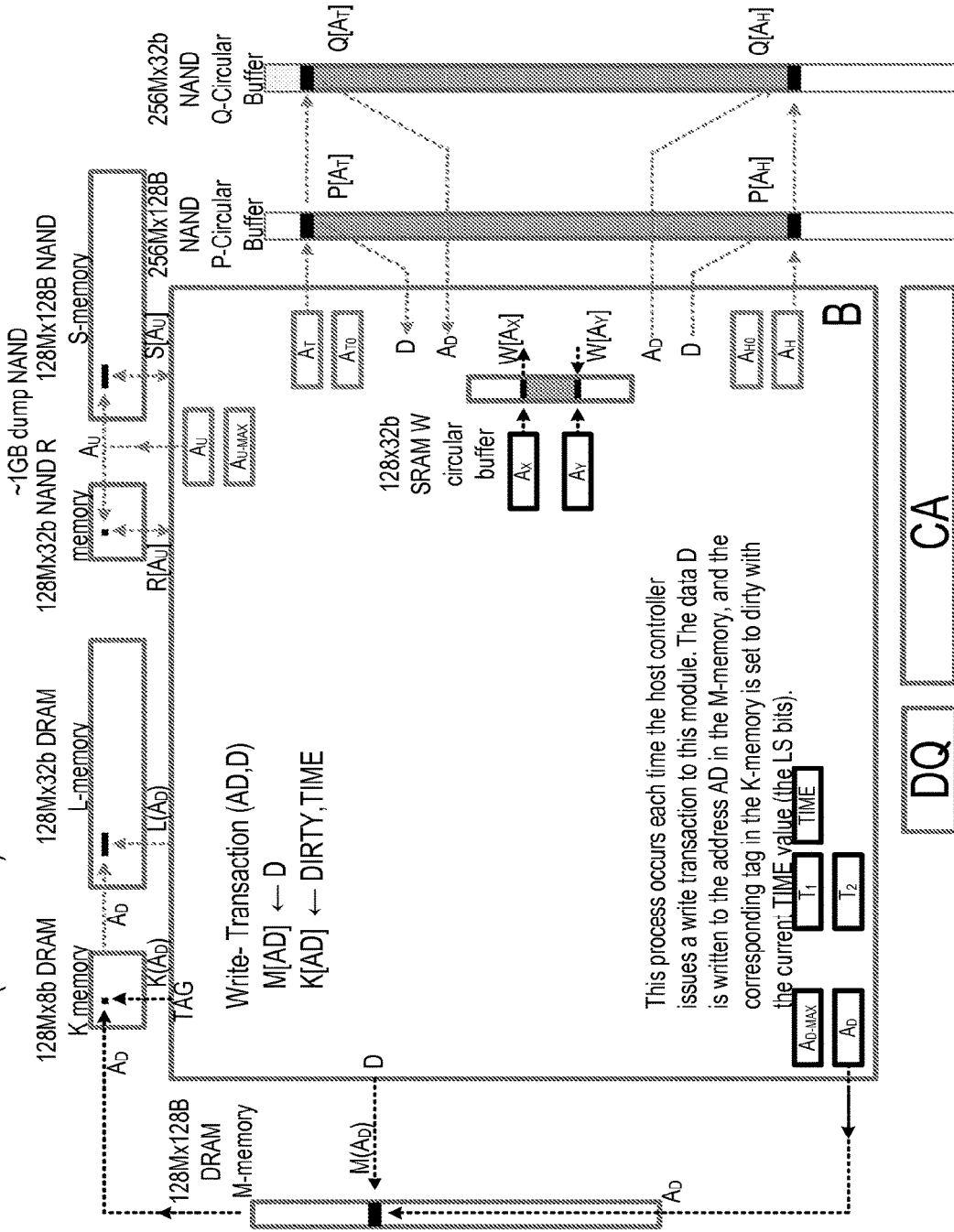
FIG. 26 illustrates, for the module of FIG. 21, module activities for a host write to DRAM.

The next six figures will show more detail of the processes which are executing within the B component. FIG. 26 shows the details of a write transaction from the host.

This process occurs each time the host controller issues a write transaction to this module. The data D is written to the address AD in the M-memory, and the corresponding tag in the K-memory is set to dirty with the current TIME value.

Note that the elements of B which are not used for a particular process are grayed out in the figure describing the process (for clarity).

Search K Memory (Tags)

Figure 27:
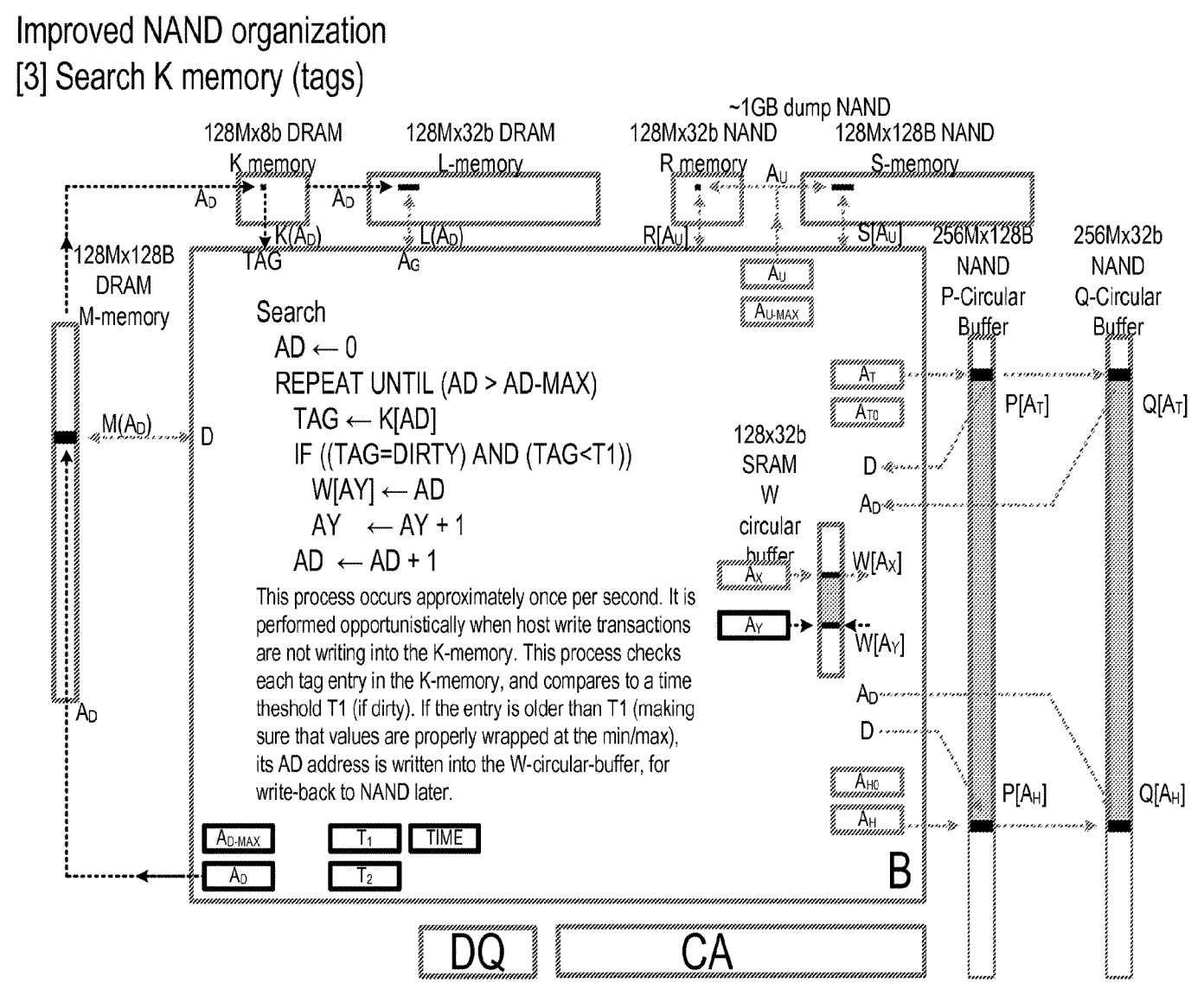

FIG. 27 shows detail for tag-scanning process.

This process occurs approximately once per second. It can run faster or slower, as a function of the rate at which host write transactions occur. The one second interval assumes that the scanning process can get about 10% of the access bandwidth of the K memory.

Tag scanning is performed opportunistically when host write transactions are not writing into the K-memory. This process checks each tag entry in the K-memory, and compares this to a time threshold T1 (if dirty).

If the entry is older than T1 (making sure that values are properly wrapped at the min/max limits), its AD address is written into the W-circular-buffer, for writeback to NAND later.

The scanning process fills the W circular buffer with addresses of dirty Dblocks in M memory, and the writeback process (described in the next section) empties the addresses from the W circular buffer and performs the data copy operation.

Writeback

Figure 28:
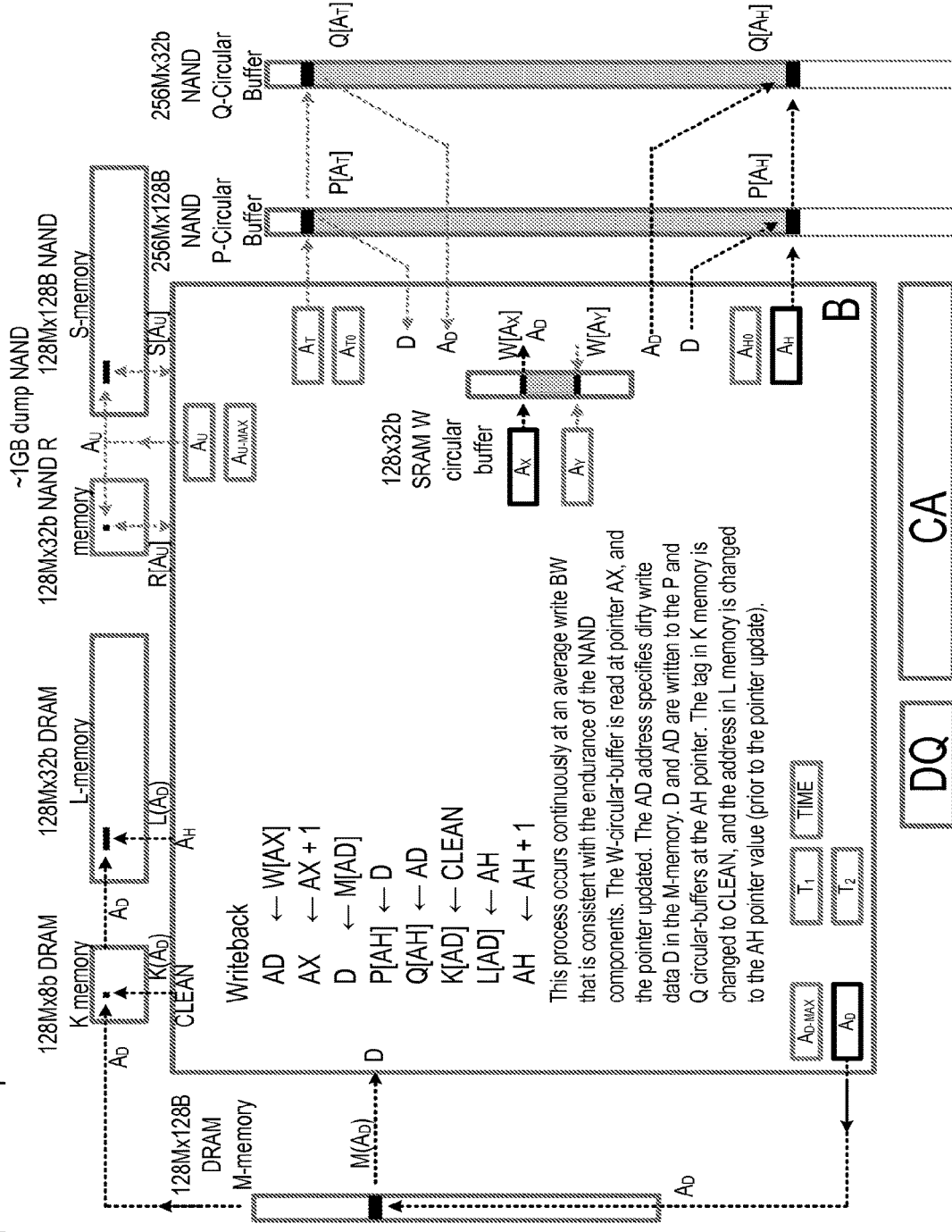
FIG. 28 illustrates, for the module of FIG. 21, module activities for a writeback process.

FIG. 28 shows detail for the writeback process. This process occurs continuously at an average write BW that is consistent with the endurance of the NAND components. For example, a module with a 32 GB NAND P memory with a $10^5$ write cycle endurance could be written at an average rate of 20 MB/s over a 5-year module lifetime.

The W-circular-buffer is read at pointer AX, and the pointer updated. The AD address specifies dirty write data D in the M-memory.

D and AD are written to the P and Q circular-buffers at the AH pointer. The tag in K memory is changed to CLEAN, and the address in L memory is changed to the AH pointer value (prior to the pointer update).

The writeback process will need to share access to the M and K memories with the normal write transactions from the host. Because the average write bandwidth to the NAND is constrained by endurance, only a small percentage of the peak DRAM bandwidth is needed.

The writeback process will also need to update control registers and tag and pointer entries in a way that can tolerate a power loss at any step.

Consolidation

Figure 29:
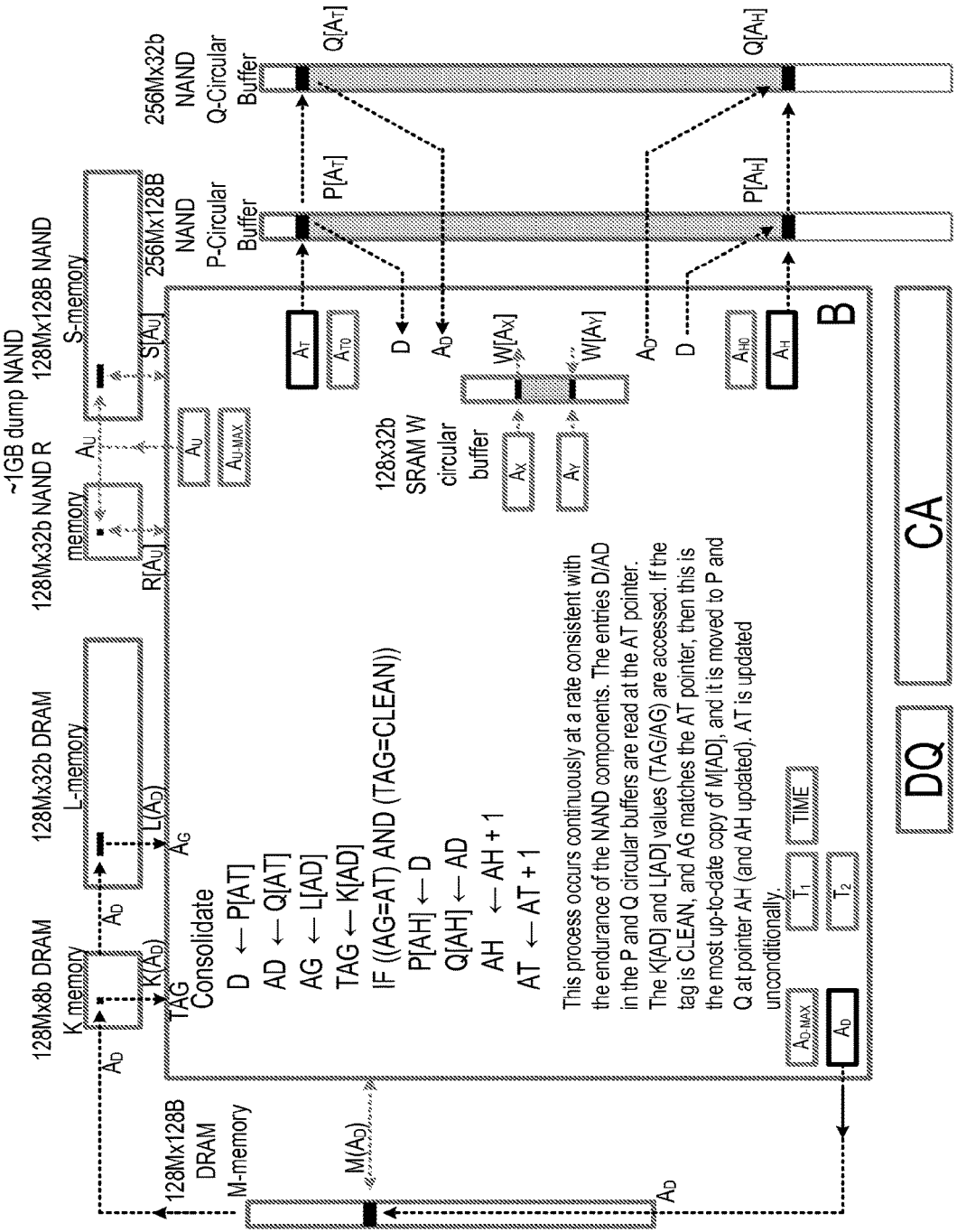
FIG. 29 illustrates, for the module of FIG. 21, module activities for a consolidation process.

FIG. 29 shows the consolidation process. This process occurs continuously at a rate consistent with the endurance of the NAND components. Typically, consolidation and writeback can occur together, e.g., each new P write block can be filled with a combination of data gathered by both processes.

For example, a module with a 32 GB NAND P memory with a $10^5$ write cycle endurance could be written at an average rate of 20 MB/s over a 5-year module lifetime.

The entries D/AD in the P and Q circular buffers are read at the AT pointer. The K[AD] and L[AD] values (TAG/AG) are accessed.

If the tag is CLEAN, and AG matches the AT pointer, then this is the most up-to-date copy of M[AD], and it is copied to P and Q at pointer AH (and AH updated). AT is updated unconditionally.

If the tag is DIRTY or AG does not match the AT pointer, then the D/AD entries are not copied.

The entries at the AT pointer are deleted, and the tail pointer updated.

This process is necessary because of the "swiss-cheesing" effect; holes are created in the P memory entries when a Dblock becomes dirty in the DRAM. The earlier copy or copies in the NAND memory become(s) invalid.

Eventually (after enough Dblocks are written back) the head pointer will wrap around and overlap into the tail pointer, without consolidation.

The consolidation process allows the invalid Dblocks to be removed. The cost of this process is that clean Dblocks at the tail pointer must be moved to the head.

The consolidation process is a consequence of the coarse write (and erase) granularity of the NAND component. Generally, the length of the used portion of P can be balanced with the desired level of dirty blocks indicated in memory K. As long as enough NAND memory remains to accommodate a dump upon power loss, the consolidation process need not perform extra housecleaning to reduce the size of the used portion of P, since this process does result in some endurance waste.

Power Loss

Figure 30:
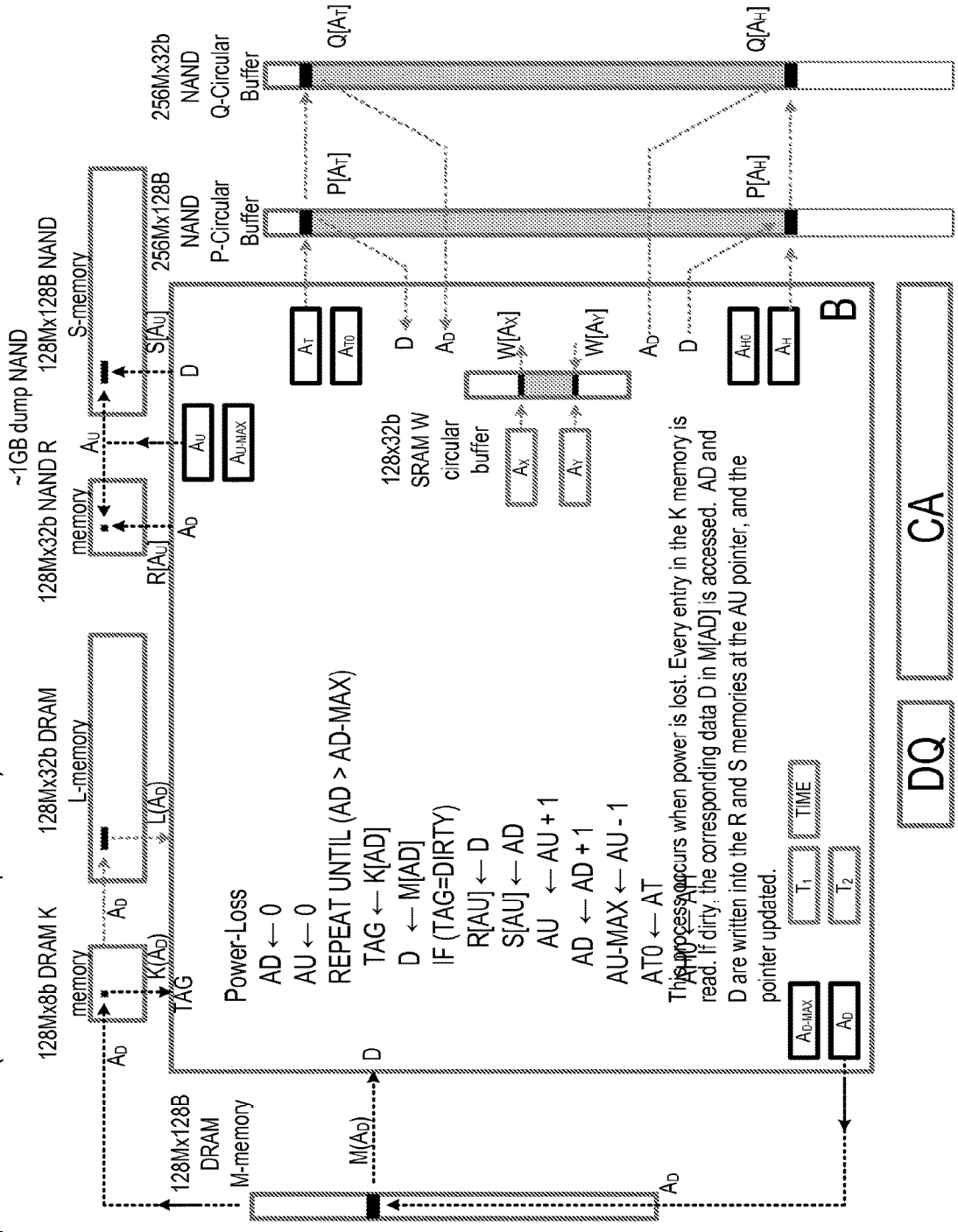
FIG. 30 illustrates, for the module of FIG. 21, module activities for an incremental state-saving process that takes place, e.g., upon power loss to the system.

FIG. 30 shows the state-saving process triggered by a power loss to the system.

This process occurs when power is lost, or when the NVDIMM is commanded to take a snapshot to NAND. Every entry in the K memory is read in turn.

If a K entry is dirty, the corresponding data D in M[AD] is accessed. AD and D are written into the R and S memories at the AU pointer, and the pointer updated.

If a K entry is clean, the data D in M[AD] is skipped because a valid copy exists in P memory.

In other words, the dirty Dblocks in DRAM M are the only memory state that needs to be saved at this time. The S and R NAND memory has been left in an erased condition, and is ready to be sequentially written with the dirty Dblocks. Note that the S and R NAND memory, in one embodiment, can be the free areas of P and Q just past the current head pointer.

Note that the Dblocks will need to be assembled into 2 KB pages using a temporary buffer on the B component—this is not shown in the figure.

It is also necessary to retain a small number of control registers—the AT0, AH0, and AUMAX values indicate the size of the clean Dblock region in the P ad Q memories, and the size of the dirty Dblock region in the R and S memories. These can be saved in a reserved region of the NAND memory space.

Note that there may also be a set of static offset values which are used to designate the start of the P, Q, R, and S regions in a shared NAND memory space. These values are not shown in the figures, but would also be saved in a reserved region of the NAND memory space.

Power Recovery—A/B

Figure 31:
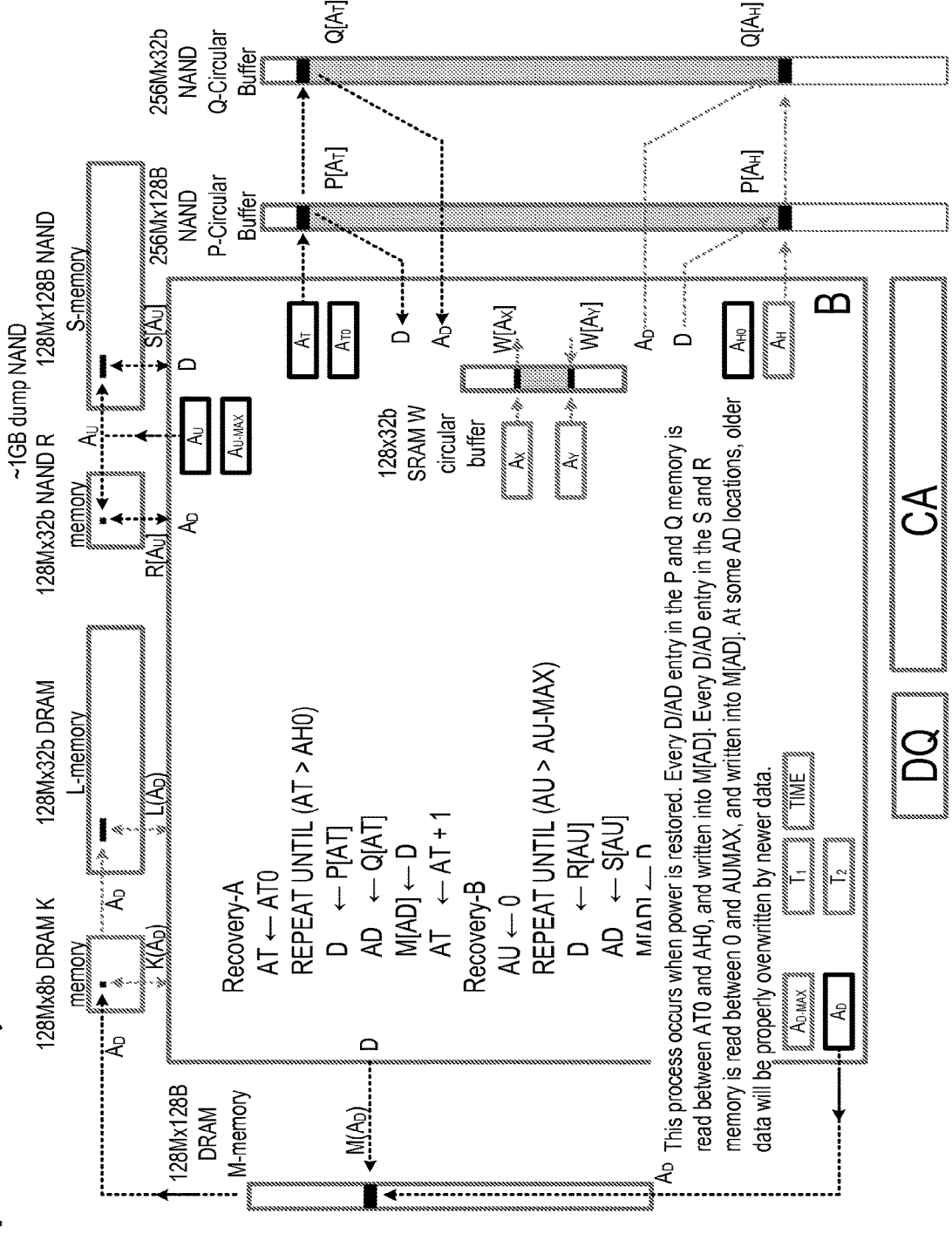
FIGS. 31 and 32 illustrate, for the module of FIG. 21, module activities for a state recovery process that runs to restore the module, e.g., upon power recovery after a shutdown.

FIG. 31 shows the first part of the power recovery process. This process occurs when power is restored.

Every D/AD entry in the P and Q memory is read between AT0 and AH0, and written into M[AD].

Every D/AD entry in the S and R memory is read between 0 and AUMAX, and written into M[AD].

At some AD locations in M, the ordering of the steps allows older data from P to be properly overwritten by newer data from P and/or S.

In other words, the P entries between the tail and head pointers can contain multiple copies of the Dblocks. When these are written into the M DRAM sequentially (starting at the tail end) the older entries of a particular Dblock will be overwritten by successively newer entries. The final clean Dblock written at each address in DRAM M will be the newest one.

The B step of power recovery involves writing the Dblocks from the S memory into M. Again, some of the S blocks will overwrite a stale block in M that was written during the A step of power recovery. This will be the proper order of restoration because the dirty block will be the newest entry for a particular address.

Power Recovery—C/D

Figure 32:
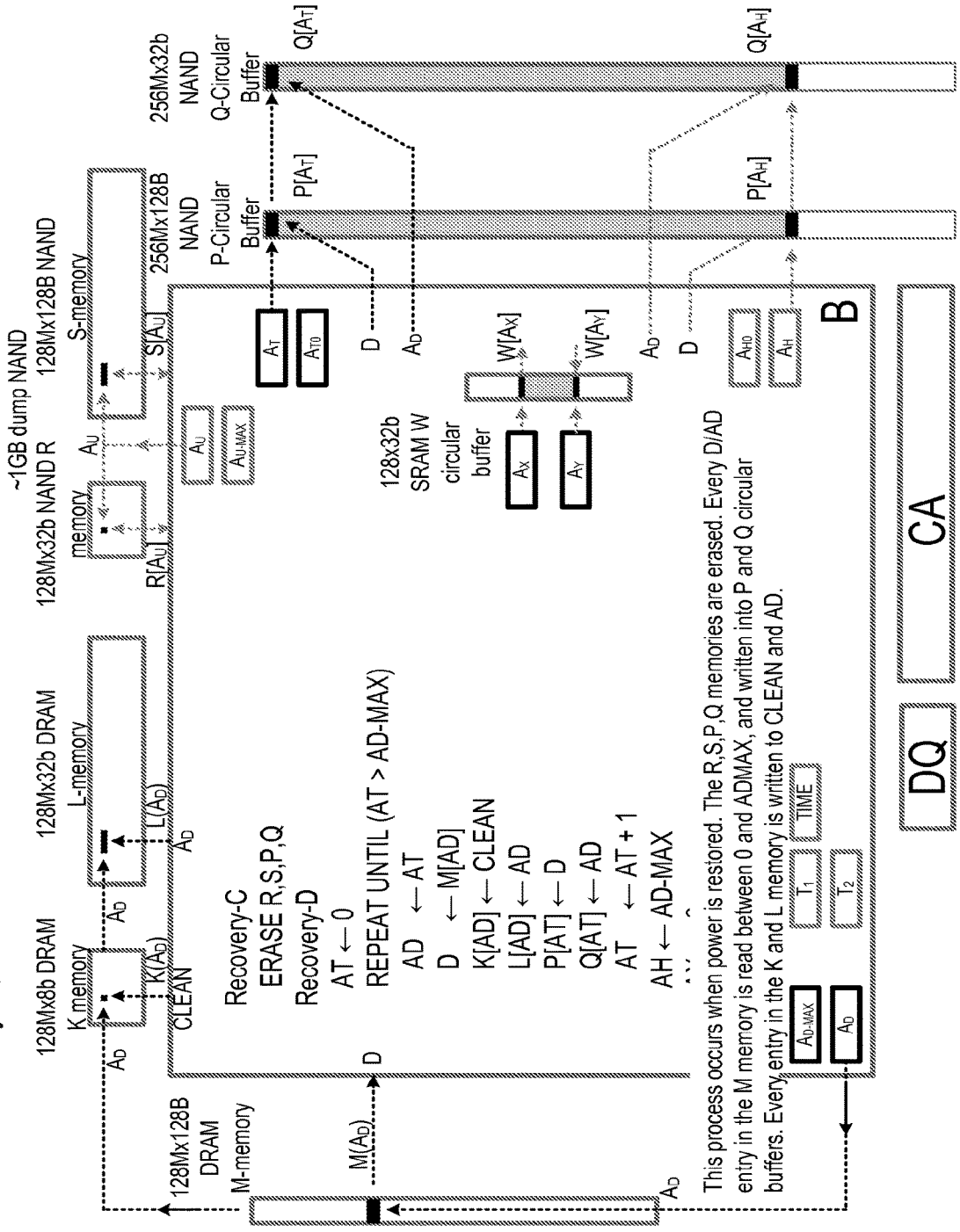

FIG. 32 shows the second part of the power recovery process.

This process occurs when power is restored and M has been repopulated. The R, S, P, Q memories are erased. Every D/AD entry in the M memory is read between 0 and ADMAX, and written into P and Q circular buffers. Every entry in the K and L memory is written to CLEAN and AD.

In other words, once the DRAM M state has been restored in the A and B steps of power recovery, the K and L DRAM and P and Q NAND must be restored.

The pseudo-code in FIG. 22 is the simplest alternative. The R, S, P, and Q memories are erased, and the M DRAM is copied to the lower half of the P NAND. The pointer entries in L and Q simply contain the address of the entry (plus any fixed offset).

An alternative process is to sequentially add the entries of the R and S dump memory to the head of the P and Q memories at power down, instead of into a separate region. Upon power-up, it would then be necessary to sequentially read each P and Q entry (from head to tail), and re-create the pointer list in the L memory while repopulating M; i.e. L[Q[AG]]<-AG, where AG ranges from head to tail. If a particular L location indicated in Q is already recreated (this can be tracked during power-up using K, for instance), that means that the current P, Q entry is stale, and no update to M or L is performed for that entry. This alternative minimizes the movement of data within the NAND memories, at a slightly higher complexity cost.

Figure 33:
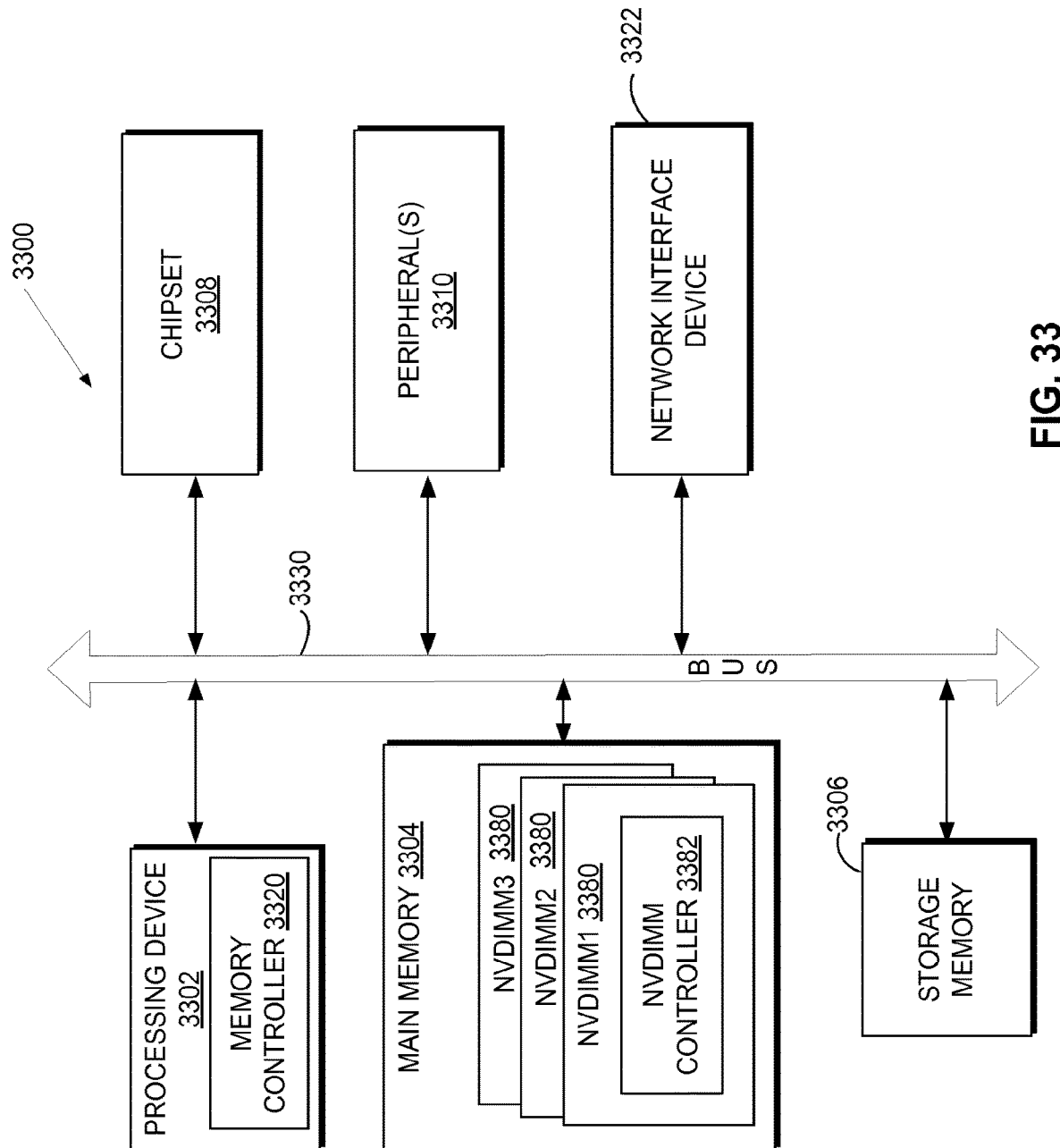
FIG. 33 is a diagram of one embodiment of a computer system, including main memory with three NVDIMMs according to one embodiment.

FIG. 33 is a diagram of one embodiment of a computer system 3300, including main memory 3304 with three NVDIMMs 3380 with NVDIMM controllers 3382 according to one embodiment. The computer system 3300 may be connected (e.g., networked) to other machines in a LAN, an intranet, an extranet, or the Internet. The computer system 3300 can be a host in a cloud, a cloud provider system, a cloud controller, a server, a client, or any other machine. The computer system 3300 can operate in the capacity of a server or a client machine in a client-server network environment, or as a peer machine in a peer-to-peer (or distributed) network environment. The machine may be a personal computer (PC), a tablet PC, a console device or set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The computer system 3300 includes a processing device 3302, a main memory 3304, and secondary memory 3306 (also referred to as storage memory) (e.g., a data storage device in the form of a drive unit, which may include fixed or removable computer-readable storage medium), which communicate with each other via a bus 3330. The main memory 3304 includes the NVDIMMs 3380 and NVDIMM controllers 3382, which are described herein.

Processing device 3302 represents one or more general-purpose processing devices such as a microprocessor, central processing unit, or the like. More particularly, the processing device 3302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 3302 may also be one or more special-purpose processing devices such as an application specific integrated circuit (ASIC), a field programmable gate array (FPGA), a digital signal processor (DSP), network processor, or the like. Processing device 3302 includes a memory controller 3320 as described above. The memory controller 3320 is a digital circuit that manages the flow of data going to and from the main memory 3304. The memory controller 220 can be a separate integrated circuit, but can also be implemented on the die of a microprocessor.

In one embodiment, the processing device 3302 may reside on a first integrated circuit and the main memory 3304 may reside on a second integrated circuit. For example, the integrated circuit may include a host computer (e.g., CPU having one more processing cores, L1 caches, L2 caches, or the like), a host controller or other types of processing devices 3302. The second integrated circuit may include a memory device coupled to the host device, and whose primary functionality is dependent upon the host device, and can therefore be considered as expanding the host device's capabilities, while not forming part of the host device's core architecture. The memory device may be capable of communicating with the host device via a DQ bus and a CA bus as described herein. For example, the memory device may be a single chip or a multi-chip module including any combination of single chip devices on a common integrated circuit substrate. The components of FIG. 33 can reside on "a common carrier substrate," such as, for example, an integrated circuit ("IC") die substrate, a multi-chip module substrate or the like. Alternatively, the memory device may reside on one or more printed circuit boards, such as, for example, a motherboard, a daughter board or other type of circuit card. In other implementations, the main memory and processing device 3302 can reside on the same or different carrier substrates.

The computer system 3300 may include a chipset 3308, which refers to a group of integrated circuits, or chips, that are designed to work with the processing device 3302 and controls communications between the processing device 3302 and external devices. For example, the chipset 3308 may be a set of chips on a motherboard that links the processing device 3302 to very high-speed devices, such as main memory 3304 and graphic controllers, as well as linking the processing device to lower-speed peripheral buses of peripherals 3310, such as USB, PCI or ISA buses.

The computer system 3300 may further include a network interface device 3322. The computer system 3300 also may include a video display unit (e.g., a liquid crystal display (LCD)) connected to the computer system through a graphics port and graphics chipset, an alphanumeric input device (e.g., a keyboard), a cursor control device (e.g., a mouse), and a signal generation device 3320 (e.g., a speaker).

In another embodiment, a system includes a non-volatile memory module including a first memory device of a first memory type and a second memory device of a second memory type. The first memory device is volatile memory and the second memory device is non-volatile memory. The system also includes a processor including a memory controller and a motherboard including a first socket in which the processor is inserted and a second socket in which the non-volatile memory module is inserted. The non-volatile memory modules is to capture a base image of data stored in the first memory device, store the base image of data in the second memory device, capture incremental updates to the data stored in the first memory device, update the base image stored in the second memory device with the incremental updates, and in response to loss of power to the system, restore the base image and any incremental updates to the first memory device.

In a further embodiment, the non-volatile memory module further includes a third memory device of the first memory type. The non-volatile memory module is to store the incremental updates in a third memory device of the first memory type. In another embodiment, the non-volatile memory module further includes a third memory device of a third memory type. The third memory type is non-volatile memory that is higher speed than the second memory type, and the non-volatile memory module is to store the incremental updates in the third memory device.

In another embodiment, a memory system includes multiple memory devices of disparate memory technologies. The memory devices include a first set of volatile memory devices and a second set of non-volatile memory devices and a third set of non-volatile memory devices that have faster speeds than the second set to capture a state of the first set of volatile memory devices to maintain data fidelity without requiring auxiliary power sources to store the state in the second set of non-volatile memory devices for memory persistence in the memory system. In a further embodiment, the third set of non-volatile memory devices is to store incremental updates to the state of the first set of volatile memory devices and the second set of non-volatile memory devices is to store an initial base image of the state of the first set of volatile memory devices. In a further embodiment, the third set is a first non-volatile memory technology for journaling and the second set is a second non-volatile memory technology for saving the initial base image. In a further embodiment, the second set supports a higher image backup rate than the second set. In another embodiment, the second set and the third set support a higher image backup rate than a memory system with auxiliary power source for memory persistence. In another embodiment, data change units are tracked and stored in the third set. In a further embodiment, the third set is used for a higher frequency of journal updates to the state than a memory system with auxiliary power source.

In another embodiment, a system includes a non-transient machine readable storage medium storing at least one technology file generated by an electronic design automation ("EDA") tool, the technology file including data for an integrated circuit comprising any of the subject matter described herein.

The previous description includes specific terminology and drawing symbols to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multiconductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The design of an integrated circuit (IC) requires that a layout be designed which specifies the arrangement of the various circuit components that will result on the major surface of the integrated circuit substrate; that is referred to as an integrated circuit layout. In generating integrated circuit layouts, designers may typically use electronic design automation ("EDA") tools. An EDA tool generates layouts by using geometric shapes that represent different materials and components on an integrated circuit. For example, an EDA tool may use rectangular lines to represent the conductors that interconnect integrated circuit components. An EDA tool may illustrate component ports with pins on their sides. These pins connect to the interconnect conductors. A net may be defined as a collection of pins that need to be electrically connected. A list of all or some of the nets in an integrated circuit layout is referred to as a netlist. A netlist specifies a group of nets, which, in turn, specify the required interconnections between a set of pins.

In one embodiment, a machine-readable medium may be used to store data representing an integrated circuit design layout. The integrated circuit layout may be generated using a netlist or other means, for examples, schematics, text files, hardware description languages, layout files, etc. The integrated circuit layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided herein.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A memory system comprising
   a plurality of memory devices of disparate memory technologies, wherein the plurality of memory devices comprises:
   a first set of volatile memory devices;
   a second set of non-volatile memory devices; and
   a third set of non-volatile memory devices that have faster speeds than the second set to capture a state of the first set of volatile memory devices to maintain data fidelity without requiring auxiliary power sources to store the state in the second set of non-volatile memory devices for memory persistence in the memory system.

2. The memory system of claim 1, wherein the third set of non-volatile memory devices is to store incremental updates to the state of the first set of volatile memory devices and the second set of non-volatile memory devices is to store an initial base image of the state of the first set of volatile memory devices.

3. The memory system of claim 2, wherein the third set is a first non-volatile memory technology for journaling the incremental updates and the second set is a second non-volatile memory technology for saving the initial base image.

4. The memory system of claim 2, wherein the third set supports a higher image backup rate than the second set.

5. The memory system of claim 2, wherein the second set and the third set support a higher image backup rate than a memory system with auxiliary power source for memory persistence.

6. The memory system of claim 3, wherein data change units are tracked and stored in the third set.

7. The memory system of claim 3, wherein the third set is used for a higher frequency of journal updates to the state than a memory system with auxiliary power source.

8. A memory module comprising:
   a first memory device of a first memory type, the first memory device storing data;
   a second memory device of a second memory type, the second memory device and storing a base image of the data stored in the first memory device, wherein the first memory device has faster access speeds than the second memory device; and
   a control element coupled to the first memory device and the second memory device, the control element to:
   capture a state of the data stored in the first memory device;
   store the state of the data in the second memory device;
   track one or more changes to the data stored in the first memory device;
   transfer the one or more changes to the second memory device to cause the state stored in the second memory device to be updated to an updated state of the data stored in the first memory device; and
   restore the updated state of the data to the first memory device after a loss of power event.

9. The memory module of claim 8, wherein the second memory device has a lower bit cost than the first memory type.

10. The memory module of claim 8, wherein the control element, to track the one or more changes to the data, is to store a journal of incremental updates.

11. The memory module of claim 8, further comprising a third memory device of the first memory type, wherein the control element, to track the one or more changes to the data, is to store a journal of incremental updates in the third memory device.

12. The memory module of claim 8, wherein the first memory device is a dynamic random access memory (DRAM) device, wherein the second memory device is at least one of a NOR flash device, a static RAM (SRAM) device, a pseudo static RAM device, an erasable programmable read only memory (EPROM) device, or an electrically erasable programmable ROM (EEPROM) device.

13. The memory module of claim 8, wherein the first memory device is a dynamic random access memory (DRAM) device, wherein the second memory device is at least one of a resistive RAM (ReRAM) device, a magnetoresistive RAM (MRAM) device, a phase-change memory device, or a racetrack memory device.

14. The memory module of claim 8, further comprising a third memory device of a third memory type, wherein the third memory device has faster access speeds than the second memory device, wherein the control element, to track the one or more changes to the data, is to store a journal of incremental updates in the third memory device.

15. The memory module of claim 14, wherein the third memory type is non-volatile memory.

16. The memory module of claim 14, wherein the first memory device is a dynamic random access memory (DRAM) device, wherein the second memory device is at least one of a NAND flash device, a NOR flash device, a static RAM (SRAM) device, a pseudo static RAM device, an erasable programmable read only memory (EPROM) device, or an electrically erasable programmable ROM (EEPROM) device, and wherein the third memory device is at least one of resistive random access memory (ReRAM) device, a magnetoresistive RAM (MRAM) device, a phase-change memory device, or a racetrack memory device.

17. The memory module of claim 14, wherein the control element is to store a scorecard in the third memory device, the scorecard indicating, for storage blocks of the first memory device, whether current contents of each storage block have been saved in the second memory device or not saved in the second memory device.

18. A method comprising:
determining, by a control element, whether a multi-tier memory system is to operate in an archive mode, wherein the multi-tier memory system comprises a first memory device of a first memory type and a second memory device of a second memory type, wherein the first memory device stores data and has faster access speeds than the second memory device;
capturing, by the control element, a state of the data stored in the first memory device;
storing, by the control element, the state of the data in the second memory device;
tracking, by the control element, one or more changes to the data stored in the first memory device;
transferring, by the control element, the one or more changes to the second memory device to cause the state stored in the second memory device to be updated to an updated state of the data stored in the first memory device;
determining, by the control element, that a system failure has occurred; and
restoring, by the control element, the updated state of the data to the first memory device after the system failure has occurred.

19. The method of claim 18, wherein the tracking comprises:
determining incremental updates to the data stored in the first memory device;
creating a journal of the incremental updates; and
storing the journal in at least one of the first memory device or a third memory device of a third memory type, wherein the third memory device has faster access speeds than the second memory device.

20. The method of claim 18, wherein the tracking comprises storing a scorecard in a third memory device of the first memory type, the scorecard indicating, for storage blocks of the first memory device, whether current contents of each storage block have been saved in the second memory device or not saved in the second memory device.

* * * * *